United States Patent
Choi et al.

(10) Patent No.: US 12,119,829 B2
(45) Date of Patent: Oct. 15, 2024

(54) CLOCK DATA RECOVERY CIRCUITS AND ELECTRONIC SYSTEMS THAT SUPPORT DATA-BASED CLOCK RECOVERY

(71) Applicant: Samsung Electronics Co., Ltd., Suwon-si (KR)

(72) Inventors: Dongho Choi, Suwon-si (KR); Jaeduk Han, Seoul (KR); Yongho Song, Suwon-si (KR); Youngho Kwak, Suwon-si (KR); Gaeryun Sung, Seoul (KR); Dongju Yang, Seoul (KR); Kwanghee Choi, Suwon-si (KR); Hyeongmin Seo, Seoul (KR)

(73) Assignees: Samsung Electronics Co., Ltd. (KR); IUCF-HYU(INDUSTRY-UNIVERSITY COOPERATION FOUNDATION HANYANG UNIVERSITY) (KR)

( * ) Notice: Subject to any disclaimer, the term of this patent is extended or adjusted under 35 U.S.C. 154(b) by 0 days.

(21) Appl. No.: 18/308,754

(22) Filed: Apr. 28, 2023

(65) Prior Publication Data
US 2023/0421161 A1     Dec. 28, 2023

(30) Foreign Application Priority Data
Jun. 24, 2022  (KR) .................. 10-2022-0077225

(51) Int. Cl.
*H03L 7/08* (2006.01)
*H03L 7/091* (2006.01)
*H03L 7/099* (2006.01)

(52) U.S. Cl.
CPC ............ *H03L 7/0807* (2013.01); *H03L 7/091* (2013.01); *H03L 7/0998* (2013.01)

(58) Field of Classification Search
CPC ..... H03L 7/0807; H03L 7/091; H03L 7/0998; H03L 7/081; H03L 7/083; H03L 7/097; H04L 7/0025; H04L 7/033; H04L 7/04
See application file for complete search history.

(56) References Cited

U.S. PATENT DOCUMENTS 7,349,509 B2   3/2008  Ribo et al.
8,385,476 B2   2/2013  Staszewski et al.
(Continued)

FOREIGN PATENT DOCUMENTS

KR      100570838 B1   4/2006
KR      20200136098 A  12/2020

*Primary Examiner* — Vineeta S Panwalkar
(74) *Attorney, Agent, or Firm* — Myers Bigel, P.A.

(57) ABSTRACT

A clock data recovery circuit includes a phase-locked loop configured to generate a plurality of clock signals having unequal phases relative to each other, in response to a received clock signal, and a phase interpolator configured to interpolate phases of the plurality of clock signals during generation of multiphase sampling clock signals. A sampling clock adjustment circuit is also provided, which is configured to generate a plurality of data symbols by sampling a received data signal at sampling time points of the multiphase sampling clock signals, and further configured to: detect, from the plurality of data symbols, a first data pattern set to have a transition point immediately before a first reference data symbol, and a second data pattern set to have a transition point immediately after a second reference data symbol, detect a first signal level of the first data pattern at a sampling time point for sampling the first reference data symbol, detect a second signal level of the second data pattern at a sampling time point for sampling the second reference data symbol, and adjust phases of the multiphase sampling clock signals according to a result of comparing the first signal level to the second signal level.

20 Claims, 15 Drawing Sheets

(56) References Cited

U.S. PATENT DOCUMENTS

| | | | |
|---|---|---|---|
| 8,629,699 B2* | 1/2014 | Wachi | H03L 7/0807 |
| | | | 327/144 |
| 2006/0280272 A1 | 12/2006 | Stojanovic | |
| 2013/0093480 A1 | 4/2013 | Staszewski et al. | |
| 2017/0171002 A1 | 6/2017 | Palmer | |
| 2020/0119901 A1* | 4/2020 | Hormati | H04L 7/0054 |
| 2020/0382269 A1 | 12/2020 | Lee et al. | |

* cited by examiner

CLOCK DATA RECOVERY CIRCUITS AND ELECTRONIC SYSTEMS THAT SUPPORT DATA-BASED CLOCK RECOVERY

REFERENCE TO PRIORITY APPLICATION

This application claims priority to Korean Patent Application No. 10-2022-0077225, filed Jun. 24, 2022, the disclosure of which is hereby incorporated herein by reference.

BACKGROUND

The present disclosure relates to clock data recovery circuits and electronic systems that recover clock signals from data signals.

Recently, various types of electronic devices have been used. An electronic device performs a unique function according to operations of electronic circuits included therein. The electronic device operates alone or operates while communicating with other electronic devices. The electronic device may employ an interface protocol to communicate with other electronic devices.

Some electronic devices may extract a clock from a transition of a specific signal (e.g., data signal) and operate based on the extracted clock. To this end, some electronic devices may include clock data recovery circuits that support data-based clock recovery. For example, some reception circuits may recover a clock from a signal received from a transmission circuit. Such reception circuits may recover, in response to the recovered clock, data corresponding to the received signal.

SUMMARY

An aspect of the present disclosure provides a clock data recovery circuit, which is capable of adjusting a phase of an edge clock and a phase of a sampling clock in real time while a reception circuit operates.

According to an embodiment, there is provided a clock data recovery circuit having a phase-locked loop therein, which is configured to output a received clock signal as a plurality of multiphase clock signals, and a phase interpolator, which is configured to interpolate phases of the multiphase clock signals to output multiphase edge clock signals and multiphase sampling clock signals. A sampling clock adjustment circuit is also provided, which is configured to: (i) generate a plurality of data symbols by sampling an externally received data signal at sampling time points of the multiphase sampling clock signals, (ii) detect, from the plurality of data symbols, a first data pattern set to have a transition point immediately before a first reference data symbol and a second data pattern set to have a transition point immediately after a second reference data symbol, (iii) detect a first signal level of the first data pattern at a sampling time point for sampling the first reference data symbol, (iv) detect a second signal level of the second data pattern at a sampling time point for sampling the second reference data symbol, and (v) adjust phases of the multiphase sampling clock signals according to a result of comparing the first signal level to the second signal level.

According to another embodiment, a data-based clock data recovery circuit is provided, which includes a phase-locked loop that is configured to output an externally received clock signal as multiphase clock signals, a phase interpolator that is configured to interpolate phases of the multiphase clock signals to output multiphase edge clock signals and multiphase sampling clock signals, and an edge clock adjust circuit that is configured to determine whether respective phases of the multiphase edge clock signals precede or lag behind a phase at which a data signal transitions, and to adjust phases of some edge clock signals among the multiphase edge clock signal until determination results of all of the multiphase edge clock signals become the same, when determination results of the some edge clock signals are different from determination results of remaining edge clock signals.

According to a further embodiment, an electronic system is provided that includes: a communication channel, a first device including a transmitter configured to output a data signal to the communication channel, and a second device including a receiver connected to the communication channel. The receiver may be configured to: (i) recover, based on transition points in time of the data signal, multiphase edge clock signals, and adjust phases of the multiphase edge clock signals such that sampling time points of the multiphase edge clock signals have an equal interval therebetween, when sampling time points of some edge clock signals among the multiphase edge clock signals precede the transition points in time and sampling time points of some of remaining edge clock signals lag behind the transition time points, (ii) sample the data signal with multiphase sampling clock signals having an intermediate phase of the multiphase edge clock signals, (iii) detect predetermined data patterns from the sampled data signal, and (iv) adjust phases of the multiphase sampling clock signals according to a result of comparing, with each other, signal levels at sampling time points for sampling respective reference data symbols of the predetermined data patterns.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, preferred example embodiments of the present disclosure will be described with reference to the accompanying drawings.

Figure 1:
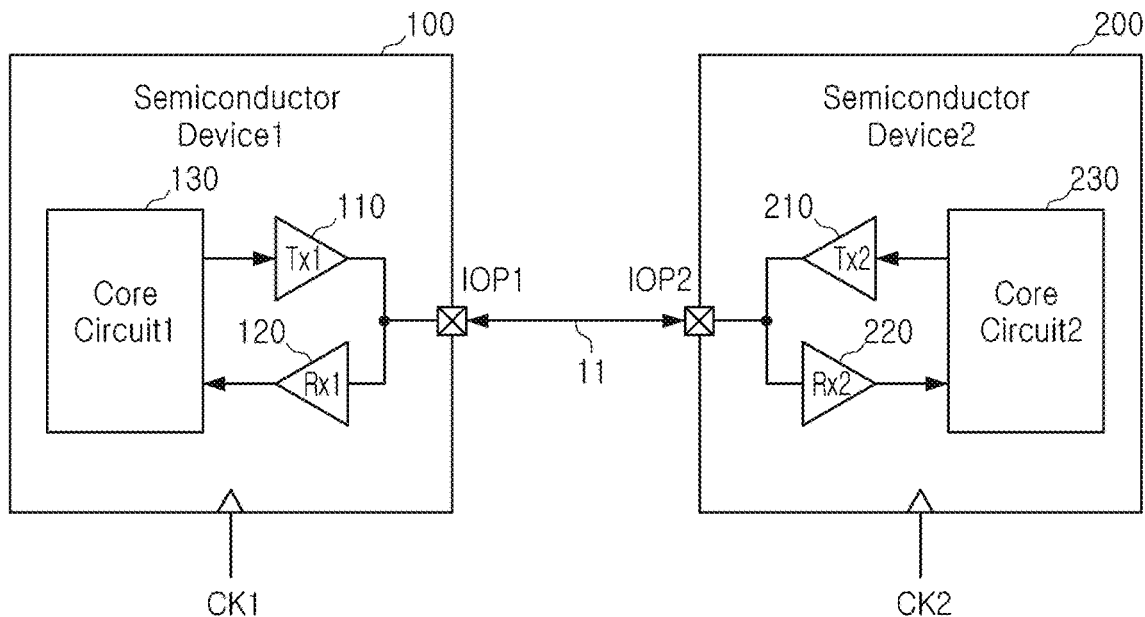
FIG. 1 is a diagram illustrating an electronic system according to an example embodiment of the present disclosure.
Figure 2:
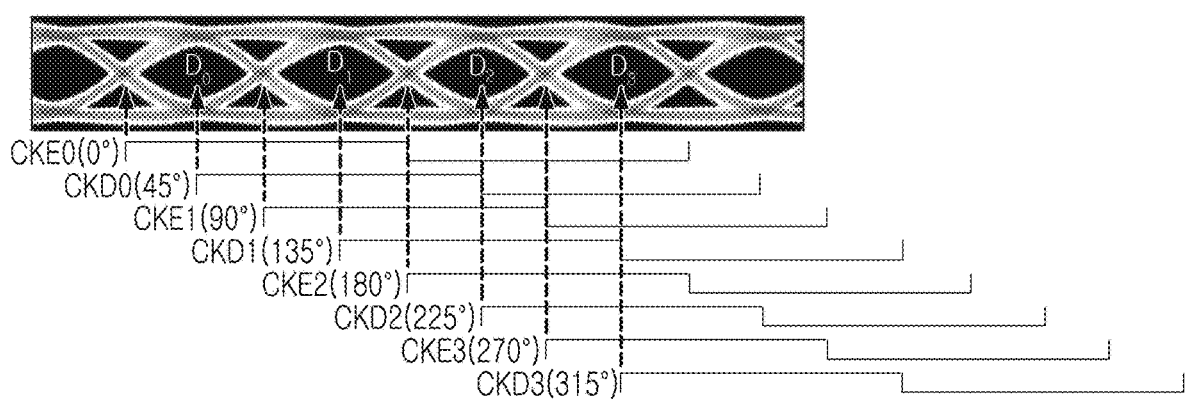
FIG. 2 is a diagram illustrating multiphase edge clocks and multiphase sampling clocks.

FIG. 1 is a diagram illustrating an electronic system according to an example embodiment of the present disclosure, and FIG. 2 is a diagram illustrating multiphase edge clocks and multiphase sampling clocks.

Referring to FIG. 1, an electronic system 10 may include a first semiconductor device 100 and a second semiconductor device 200 that communicate with each other via a channel 11.

As shown, the first semiconductor device 100 may include a first transmitter 110, a first receiver 120, and a first core circuit 130. The second semiconductor device 200 may include a second transmitter 210, a second receiver 220, and a second core circuit 230. The first core circuit 130 may control an overall operation of the first semiconductor device 100, and the second core circuit 230 may control an overall operation of the second semiconductor device 200. The second receiver 220 may receive signals from the first transmitter 110, and the first receiver 120 may receive signals from the second transmitter 210. Thus, the second semiconductor device 200 may communicate over the channel 11 with the first semiconductor device 100.

The first semiconductor device 100 may input/output data signals via one or more first input/output pins IOP1, and the second semiconductor device 200 may input/output data signals via one or more second input/output pins IOP2. For example, a data signal input/output via the input/output pins IOP1 and IOP2 may be a differential signal. However, the present disclosure is not limited thereto.

In some example embodiments, the electronic system 10 may be implemented in a single electronic device. As an example, the electronic system 10 may include one of various electronic devices such as a desktop computer, a laptop computer, a tablet computer, a smartphone, a wearable device, a server, a workstation, and the like. The semiconductor devices 100 and 200 may include devices assembled, mounted, or embedded in the electronic system 10.

In some example embodiments, the electronic system 10 may be implemented in a plurality of electronic devices, and the semiconductor devices 100 and 200 may be implemented in separate electronic devices. For example, each of the semiconductor devices 100 and 200 may include one of various electronic devices such as a desktop computer, a laptop computer, a tablet computer, a smartphone, a wearable device, a server, a workstation, and the like. The semiconductor devices 100 and 200 may include the same type of electronic device or different types of electronic devices.

The first semiconductor device 100 may operate in synchronization with a first clock signal CK1 externally input, and the second semiconductor device 200 may operate in synchronization with a second clock signal CK2 externally input. The clock signals CK1 and CK2 may be input from the same clock generation circuit included in the electronic system 10, but may also be input from clock generation circuits independent of each other.

The second receiver 220 may generate a data symbol by sampling a data signal received from the first transmitter 110 at a rising edge or a falling edge of a clock signal. The second core circuit 230 may receive the data symbol, and perform, based on the received data symbol, a unique function of the second semiconductor device 200, and provide a unique service.

In response to a demand for a high-performance electronic system 10, a symbol rate of a data signal exchanged between the semiconductor devices 100 and 200 may tend to increase. The second receiver 220 may use multiphase clock signals to sample a data signal having a high symbol rate using a clock signal having a limited magnitude of frequency. For example, when the second receiver 220 samples the data signal at a rising edge of each of four clock signals having a phase difference of 90 degrees therebetween, then the second receiver 220 may sample a data signal having a symbol rate four times higher than the frequencies of the clock signals.

The second receiver 220 may generate multiphase clock signals for sampling the data signal using a data signal received from the first transmitter 110, and may sample the data signal using the multiphase clock signals. The second receiver 220 may include a clock data recovery circuit to generate the multiphase clock signals and sample the data signal.

Referring to FIGS. 1 and 2 together, the second receiver 220 may receive a data signal from the first transmitter 110. FIG. 2 illustrates an eye diagram of a data signal received by the second receiver 220. In the example of FIG. 2, the data signal may have one of two logic states for each sampling cycle. However, the present disclosure is not limited thereto.

The second receiver 220 may generate the multiphase edge clock signals CKE0 to CKE3 by detecting a phase at a point in time at which the data signal transitions. For example, the edge clock signals CKE0 to CKE3 may have a phase difference of 90 degrees therebetween. The second receiver 220 may generate multiphase sampling clock signals CKD0 to CKD3 having a phase having an intermediate value of phases of the edge clock signals CKE0 to CKE3. For example, when the edge clock signal CKE0 has a phase of 0 degrees and the edge clock signal CKE1 has a phase of 90 degrees, the second receiver 220 may generate the sampling clock signal CKD0 having a phase of 45 degrees. In addition, the second receiver 220 may generate data symbols D0 to D3 by sampling the data signal at a rising edge of each of the sampling clock signals CKD0 to CKD3.

FIG. 2 illustrates a case in which the multiphase edge clock signals CKE0 to CKE3 are adjusted to have a precise phase difference of 90 degrees therebetween. Rising edges of the adjusted multiphase edge clock signals CKE0 to CKE3 may have an equal interval therebetween. However, phases of the multiphase edge clock signals CKE0 to CKE3 may change according to differences in process, voltage, and temperature (PVT) of the second semiconductor device 200 (i.e., a change in an operating environment or a difference in a semiconductor manufacturing process). The multiphase edge clock signals CKE0 to CKE3 may separate clock signals. Thus, when an operating environment of the second semiconductor device 200 changes, the phases of the multiphase edge clock signals CKE0 to CKE3 may change independently. As a result, a space between the phases and the rising edges of the multiphase edge clock signals CKE0 to CKE3 may change.

FIG. 2 illustrates a case in which rising edges of the multiphase sampling clock signals CKD0 to CKD3 are positioned at the center of rising edges of adjacent edge clock signals. However, the rising edges of the multiphase sampling clock signals CKD0 to CKD3 positioned at the center of the rising edges of the multiphase edge clock signals CKE0 may not necessarily bring about an optimal sampling result. In addition, the phases of the multiphase sampling clock signals CKD0 to CKE3 may also change according to a difference in PVT of the second semiconductor device 200.

According to an example embodiment of the present disclosure, there is proposed a clock data recovery circuit capable of adjusting the phase of the multiphase edge clock signals CKE0 to CKE3 in real time by detecting a change in a phase space between the multiphase edge clock signals CKE0 to CKE3. In addition, there is proposed a clock data recovery circuit capable of adjusting the phases of the multiphase sampling clock signals CKD0 to CKD3 to an optimal phase such that a sampling error of a data signal is minimized.

Hereinafter, a clock data recovery circuit and an electronic system including the clock data recovery circuit according to an example embodiment of the present disclosure will be described in more detail with reference to FIGS. 3 to 17. In particular, an example embodiment of the present disclosure will be described with reference to FIGS. 3 to 17, taking a case in which the multiphase edge clock signals CKE0 to CKE3 and the multiphase sampling clock signals CKD0 to CKD3 are 4-phase clock signals, as an example. However, the present disclosure is not limited thereto. For example, even when multiphase clock signals are 2-phase clock signals or 8-phase clock signals, a clock data recovery circuit and electronic system according to example embodiments of the present disclosure may adjust phases of the clock signals, and may adjust phases of multiphase clock signals having various numbers of phases.

Figure 3:
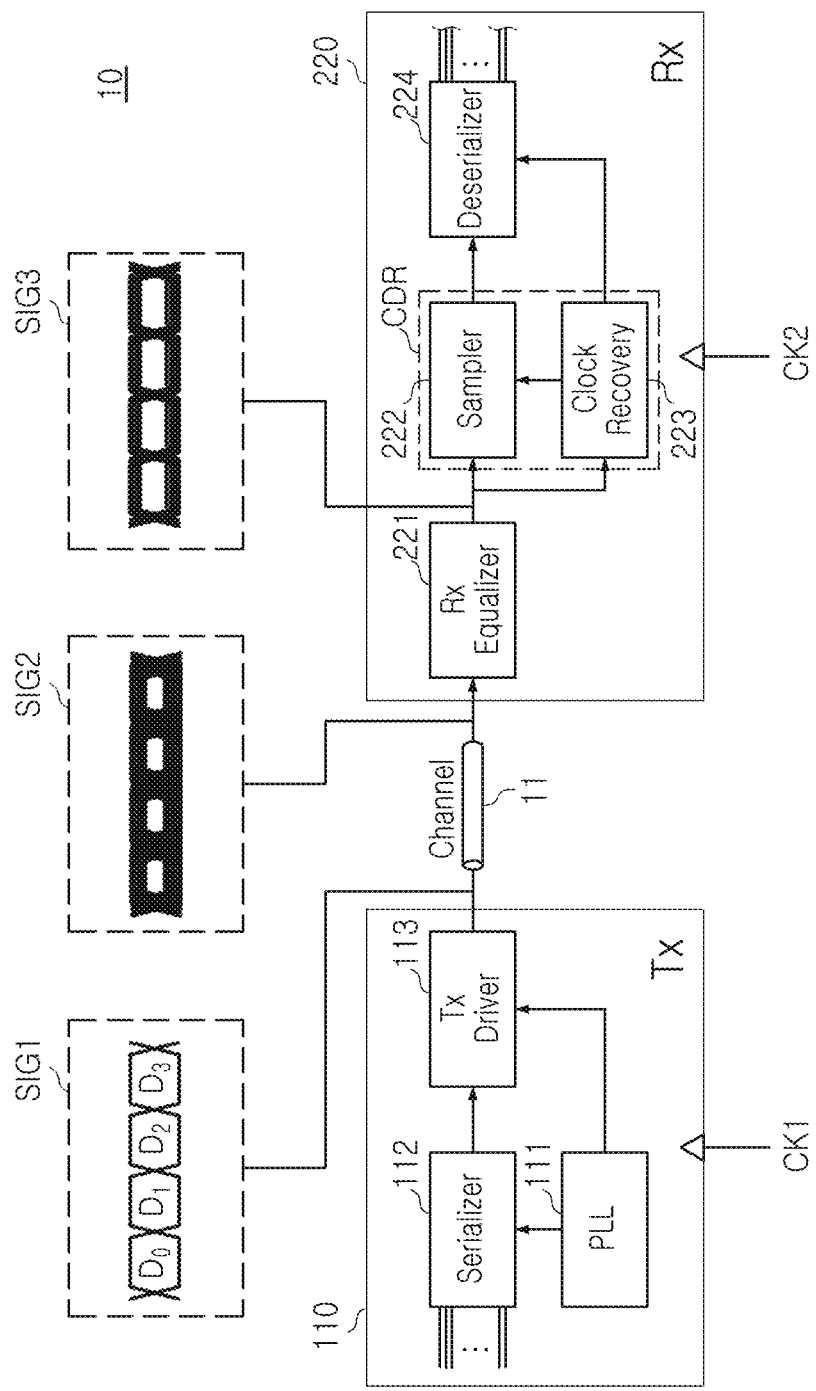
FIG. 3 is a diagram more specifically illustrating configurations of a transmitter and a receiver in the electronic system of FIG. 1.

FIG. 3 is a diagram more specifically illustrating configurations of a transmitter and a receiver in the electronic system of FIG. 1. FIG. 3 illustrates a first transmitter 110, a channel 11, and a second receiver 220 included in the electronic system 10 of FIG. 1. The first transmitter 110 may include a phase locked loop circuit 111, a serializer 112, and a transmission driver 113.

The phase locked loop circuit 111 may lock a phase of the first clock signal CK1 received externally, and may supply, as an operation clock, the phase-locked clock signal to the serializer 112 and the transmission driver 113. The serializer 112 may change a parallel data signal received by the first core circuit 130 described with reference to FIG. 1 into a serial data signal.

The transmission driver 113 may output the serial data signal via the channel 11. The transmission driver 113 may minimize a signal reflected from the channel 11 by performing impedance matching with the channel 11, and may output a data signal SIG1 having minimized noise.

The second receiver 220 may include an equalizer 221, a sampler 222, a clock recovery unit 223, and a deserializer 224. The equalizer 221 may filter a signal from channel 11.

The channel 11 may have a property of a low pass filter, and a data signal SIG2 received from the channel 11 may have a reduced eye margin, as compared to a data signal SIG1 due to inter-symbol interference (ISI). The equalizer 221 may generate a data signal SIG3 having an improved eye margin by filtering the data signal SIG2 with a high pass filter.

The sampler 222 may generate a data symbol by sampling the data signal SIG3 using a sampling clock signal. As described with reference to FIGS. 1 and 2, the sampling clock signal may include multiphase sampling clock signals. The clock recovery unit 223 may generate, based on the data signal SIG3, multiphase sampling clock signals, and may provide the multiphase sampling clock signals to the sampler 222. The clock recovery unit 223 generating sampling clock signals using the data signal and the sampler 222 sampling the data signal using the sampling clock signals may be collectively referred to as a clock data recovery circuit CDR. The deserializer 224 may generate a parallelized data signal using a data symbol sampled from the sampler 222, and may provide the parallelized data signal to the second core circuit 230 described with reference to FIG. 1.

Figure 4:
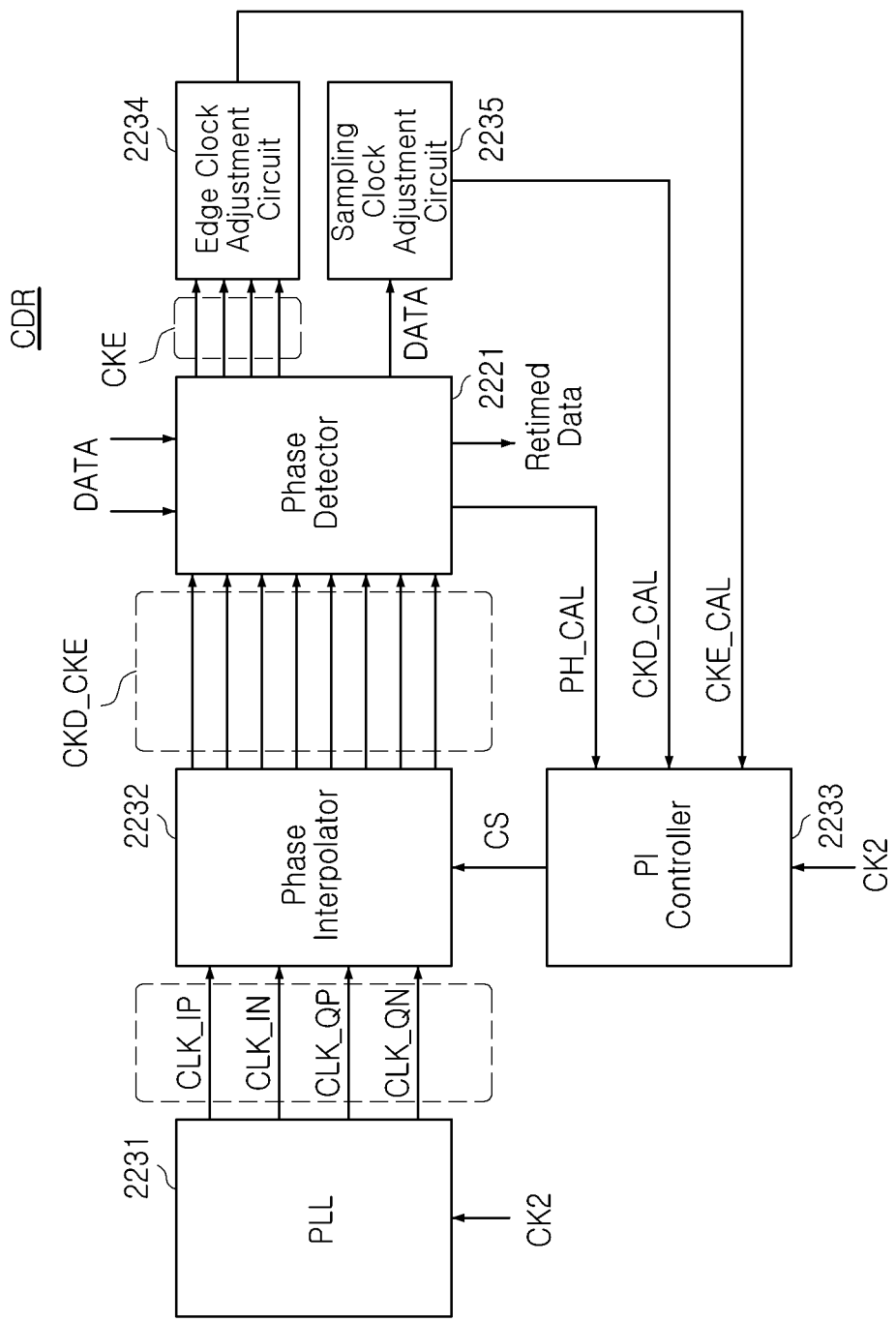
FIG. 4 is a diagram more specifically illustrating a clock data recovery circuit in the receiver of FIG. 3.

FIG. 4 is a diagram more specifically illustrating a clock data recovery circuit in the receiver of transition FIG. 3. As shown by FIG. 4, the clock data recovery circuit CDR may include a phase locked loop circuit 2231, a phase interpolator 2232, a phase interpolation controller 2233, a phase detector 2221, an edge clock adjustment circuit 2234, and a sampling clock adjustment circuit 2235.

The phase locked loop circuit 2231 may multiply the second clock signal CK2 externally received, and adjust a phase of the multiplied clock signal, thereby outputting phase-locked clock signals CLK_IP, CLK_IN, CLK_QP, and CLK_QN. For example, the phase locked loop circuit 2231 may output a clock signal CLK_IP having a phase the same as that of the second clock signal CK2, a clock signal CLK_IN having a phase opposite to that of the clock signal CLK_IP, and clock signals CLK_QP and CLK_QN having phases delayed by 90 degrees from the clock signals CLK_IP and CLK_IN.

The phase interpolator 2232 may interpolate phases of the clock signals CLK_IP, CLK_IN, CLK_QP, and CLK_QN output from the phase locked loop circuit 2231 to output multiphase edge clock signals CKE and multiphase sampling clock signals CKD. Interpolating the phases may refer to generating clock signals having a phase corresponding to a value between the phases of the clock signals CLK_IP, CLK_IN, CLK_QP, and CLK_QN using the clock signals CLK_IP, CLK_IN, CLK_QP, and CLK_QN.

The phase interpolation controller 2233 may provide a control signal CS to the phase interpolator 2232 so as to control phase values of the multiphase edge clock signals CKE and the multiphase sampling clock signals CKD to be output from the phase interpolator 2232. For example, the control signal CS may include a code value corresponding to a phase value to be controlled. The phase detector 2221 may receive a data signal DATA and clock signals CKD and CKE. The phase detector 2221 may compare a phase at a point in time at which the data signal DATA transitions with phases of the multiphase edge clock signals CKE by comparing the data signal DATA and the multiphase edge clock signals CKE with each other, and may output a phase adjustment signal PH_CAL according to a comparison result. The phase adjustment signal PH_CAL may be a feedback signal for adjusting phases of the clock signals CKD and CKE.

Figure 5:
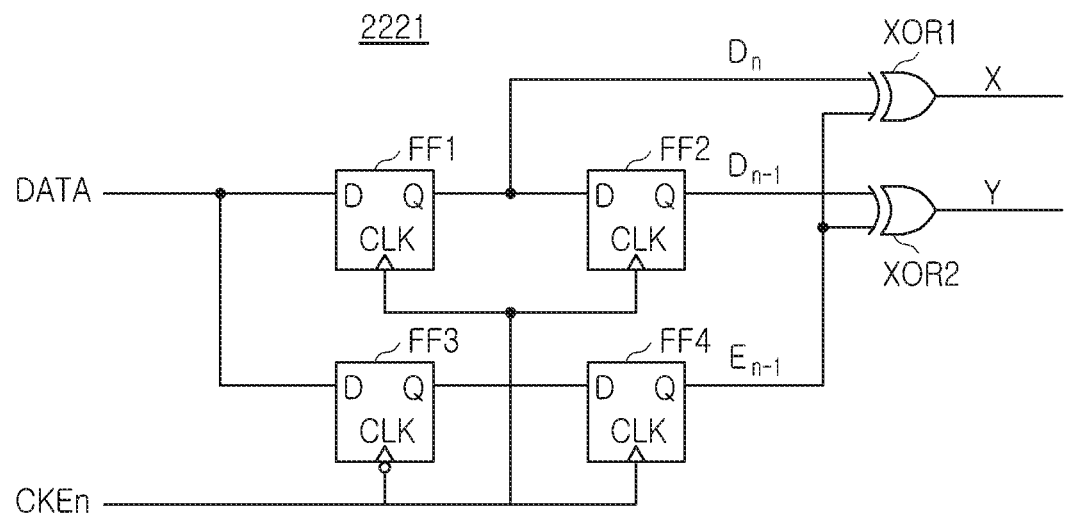
FIG. 5 is a diagram more specifically illustrating a phase detector in the clock data recovery circuit of FIG. 4.

FIG. 5 is a diagram more specifically illustrating a phase detector in the clock data recovery circuit of FIG. 4. Referring to FIG. 5, the phase detector 2221 may be a bang-bang phase detector. The bang-bang phase detector may include flip-flops FF1 to FF4 and XOR gates XOR1 and XOR2. The data signal DATA may be input to a first flip-flop FF1 and a third flip-flop FF3. The first flip-flop FF1 and second flip-flop FF2 may sample input data at a rising edge of a clock signal CKE, and may respectively output Dn and Dn−1. In addition, the third flip-flop FF3 and a fourth flip-flop FF4 may delay the data signal DATA by half a clock cycle to output En−1. The XOR gates XOR1 and XOR2 may respectively compare Dn and En−1 to determine whether the data signal DATA precedes or lags behind the clock signal CKE.

The phase detector 2221 may output the phase adjustment signal PH_CAL to the phase interpolation controller 2233 according to a result of determining whether the data signal DATA precedes or lags behind the clock signal CKE. The phase interpolation controller 2233 may adjust, based on the phase adjustment signal PH_CAL, a code value of the control signal CS, and may output the adjusted control signal CS to the phase interpolator 2232. When a feedback loop of the phase interpolator 2232, the phase detector 2221, and the phase interpolation controller 2233 is repeatedly cycled, a phase difference between the data signal DATA and the clock signal CKE may be reduced. As will be understood by those skilled in the art, even when the phases of the multiphase edge clock signals CKE are adjusted to have an equal interval therebetween by phase adjustment of the phase detector 2221, the phases of the multiphase edge clock signals CKE may change due to a change in temperature of the second semiconductor device 200 or a change in voltage supplied to the second semiconductor device 200.

Referring back to FIG. 4, the edge clock adjustment circuit 2234 may generate an edge clock adjustment signal CKE_CAL to adjust a changing phase space between the edge clock signals CKE of the second semiconductor device 200, and may output the generated edge clock adjustment signal CKE_CAL to the phase interpolation controller 2233. In addition, the sampling clock adjustment circuit 2235 may generate a sampling clock adjustment signal CKD_CAL to adjust phases of the sampling clock signals CKD to an optimal phase such that a sampling error of a data signal is minimized, and may output the sampled clock adjustment signal CKD_CAL to the phase interpolation controller 2233.

For example, all of the phase adjustment signal PH_CAL output from the phase detector 2221, the edge clock adjustment signal CKE_CAL output from the edge clock adjustment circuit 2234, and the sampling clock adjustment signal CKD_CAL output from the sampling clock adjustment circuit 2235 may be input to the phase interpolation controller 2233 to participate in phase adjustment of the clock signals CKD and CKE in real time. The phase detector 2221 may coarsely adjust the phases of the clock signals CKD and CKE by detecting an edge of the data signal DATA. In addition, the edge clock adjustment circuit 2234 may finely adjust the phases of the edge clock signals CKE such that the edge clock signals CKE have an equal interval therebetween, and the sampling clock adjustment circuit 2235 may finely adjust the sampling clock signals CKD to have an optimal phase in which a sampling error of a data signal is minimizable.

According to example embodiments of the present disclosure, the clock data recovery circuit CDR may adjust the phases of the clock signals CKD and CKE, which may change during operation of the second semiconductor device 200, thereby reducing a sampling error rate and improving reliability of the second semiconductor device 200. The clock data recovery circuit CDR may be applied to the second receiver 220 as well as to the first receiver 120, thereby improving reliability of the first semiconductor device 100.

Figure 6:
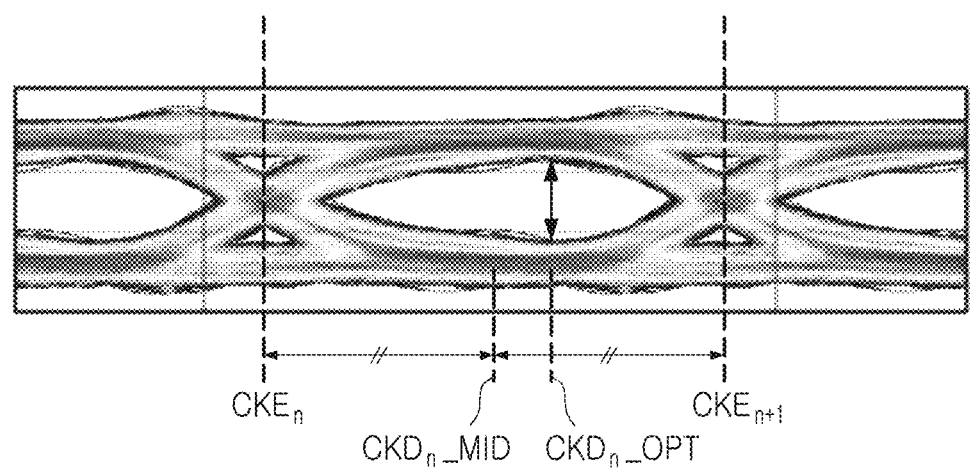
FIG. 6 is a diagram schematically illustrating a method of adjusting phases of multiphase sampling clocks according to an example embodiment of the present disclosure.

Hereinafter, a method of adjusting phases of multiphase sampling clocks according to an example embodiment of the present disclosure will be described in detail with reference to FIGS. 6 to 10. In particular, FIG. 6 is a diagram schematically illustrating a method of adjusting phases of multiphase sampling clocks according to an example embodiment of the present disclosure. This diagram illustrates an eye diagram of a data signal.

Sampling time points of edge clock signals CKEn and CKEn+1 having phases adjacent to each other and a sampling time point of a sampling clock signal CKDn between the edge clock signals CKEn and CKEn+1 are illustrated on the eye diagram. Here, the sampling time point may be a point in time at which clock signals have a rising edge, but the present disclosure is not limited thereto. The sampling time point may be a point in time at which clock signals have a falling edge, or may be each point in time having a rising edge and a falling edge.

In the example of FIG. 6, the sampling time points of the edge clock signals CKEn and CKEn+1 may be precisely positioned in a transition section of the data signal. A phase of the sampling clock signal CKDn may be adjusted based on the edge clock signals CKEn and CKEn+1. For example, the sampling clock signal CKDn whose phase is adjusted such that the sampling time point of the sampling clock signal CKDn is at the center of the sampling time points of the edge clock signals CKEn and CKEn+1 is illustrated as a central sampling clock signal CKDn_MID When the data signal is sampled at a point in time at which an eye margin of the data signal is maximized, sampling accuracy may be highest. A sampling time point of the central sampling clock signal CKDn_MID may not necessarily correspond to the point in time at which the eye margin is maximized.

The point in time at which the eye margin of the data signal is maximized may be different from the sampling time point of the central sampling clock signal CKDn_MID. For example, a delay may occur in a data signal received by the second receiver 220 via the channel 11. As the data signal has a higher symbol rate, the delay occurring in the data signal may have a greater effect on a form of the eye diagram of the data signal.

According to an example embodiment of the present disclosure, a clock data recovery circuit may determine an optimal sampling clock signal CKDn_OPT allowing data to be sampled at the point in time at which the eye margin of the data signal is maximized. Specifically, when the data signal has a weak data pattern in which a sampling error is highly likely to occur, the clock data recovery circuit may determine a signal level of the data signal at the sampling time point of the sampling clock signal CKDn. The clock data recovery circuit may adjust the phase of the sampling clock signal CKDn according to a result of comparing signal levels of weak data patterns with each other. According to an example embodiment of the present disclosure, the clock data recovery circuit may adjust the phases of the sampling clock signals CKDn in consideration of the weak data patterns, such that data may be sampled at the point in time at which the eye margin of the data signal is maximized. Accordingly, a sampling error rate of the data signal may be reduced.

Figure 7:
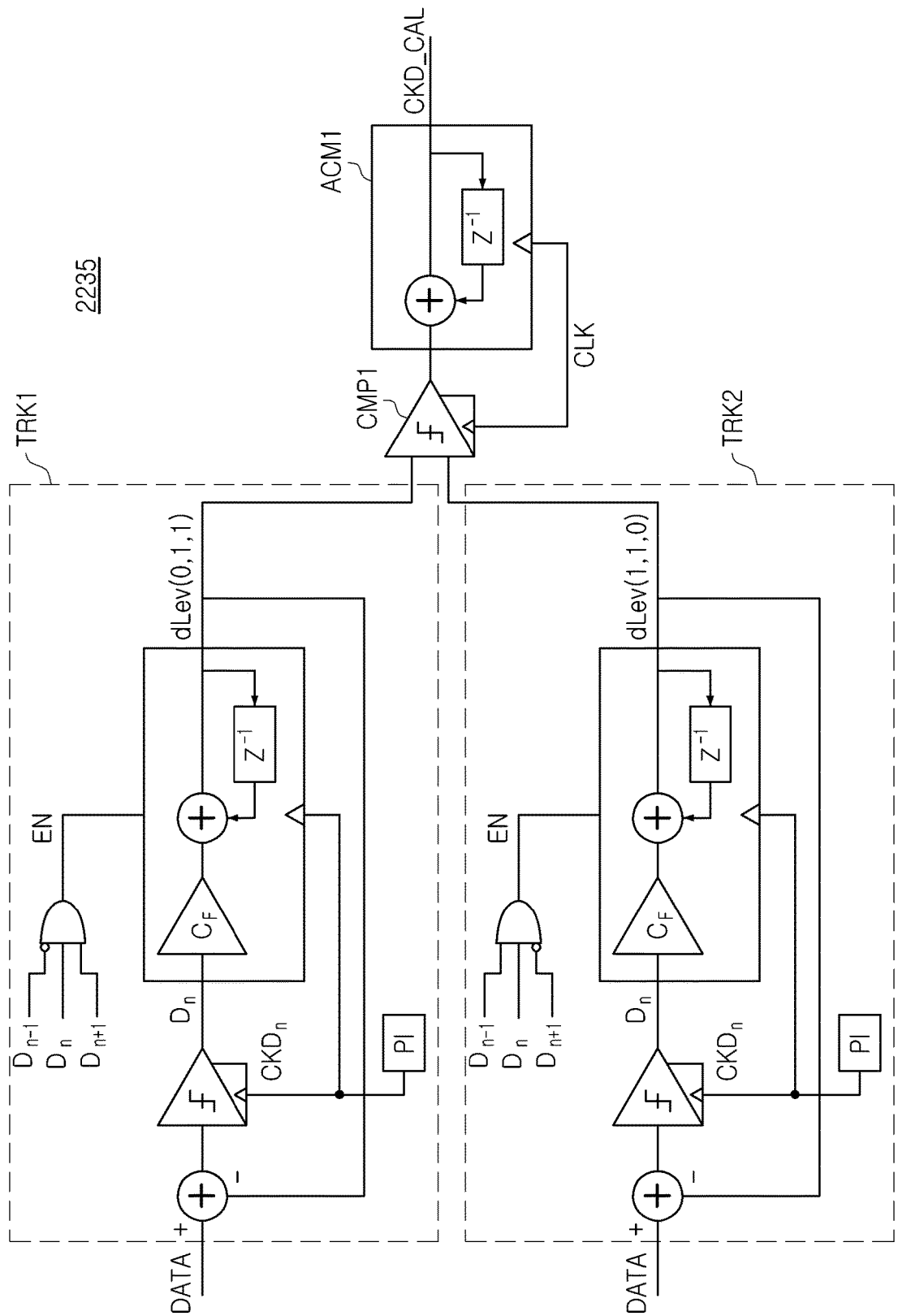
FIGS. 7 and 8 are diagrams more specifically illustrating a sampling clock adjustment circuit in the clock data recovery circuit of FIG. 4.
Figure 8:
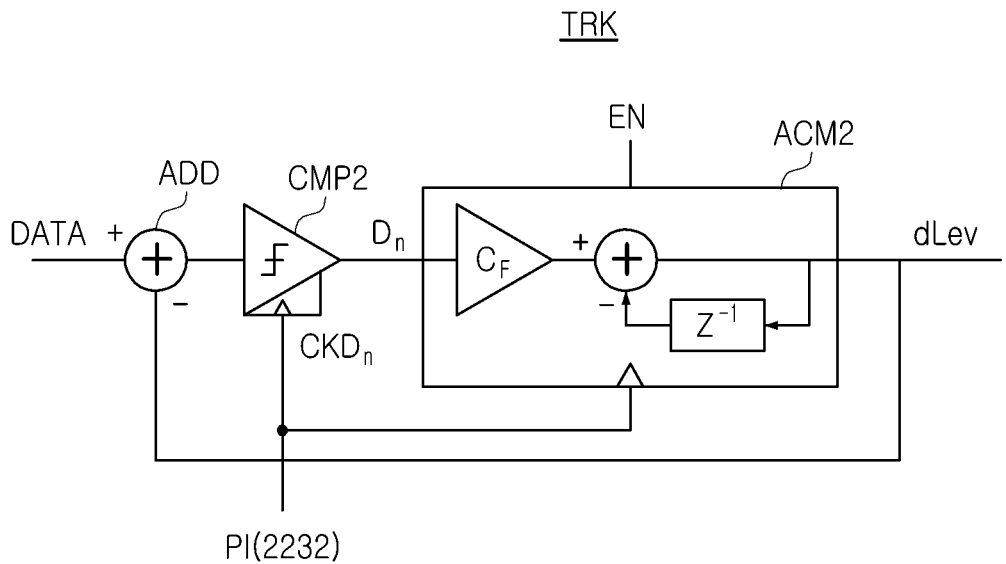
Figure 9:
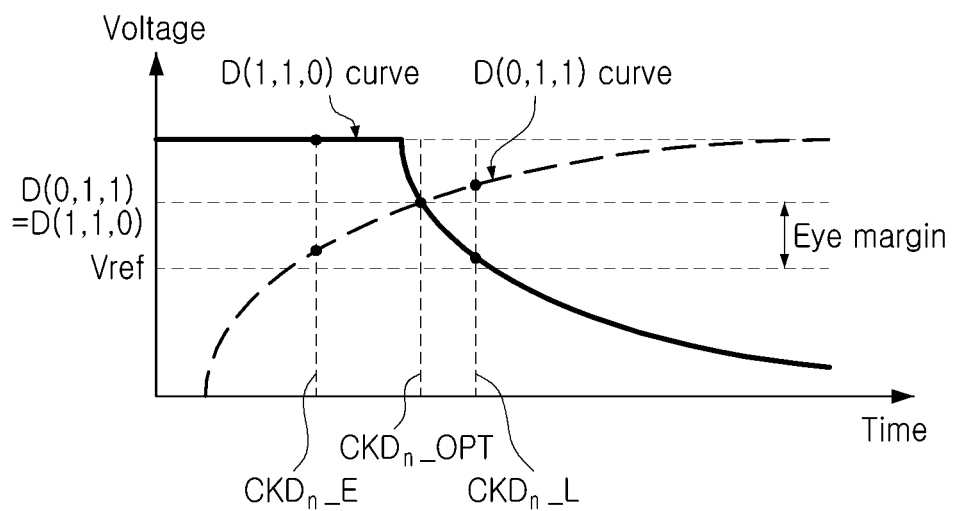
FIG. 9 is a diagram illustrating a method of adjusting phases of multiphase sampling clocks according to an example embodiment of the present disclosure.

FIGS. 7 and 8 are diagrams more specifically illustrating a sampling clock adjustment circuit in the clock data recovery circuit of FIG. 4. FIG. 9 is a diagram illustrating a method of adjusting phases of multiphase sampling clocks according to an example embodiment of the present disclosure.

Referring to FIG. 7, the sampling clock adjustment circuit 2235 may include level trackers TRK1 and TRK2, a first comparator CMP1, and a first accumulator ACM1. The level trackers TRK1 and TRK2 may have structures similar to each other.

Referring to FIG. 8, a level tracker TRK may include an adder ADD, a second comparator CMP2, and a second accumulator ACM2. The level tracker TRK may correspond to a structure of any of the level trackers TRK1 and TRK2 of FIG. 7. The second accumulator ACM2 may be enabled in response to an enable signal EN. The second comparator CMP2 and the second accumulator ACM2 may operate in synchronization with the sampling clock signal CKDn supplied from the phase interpolator 2232. The second comparator CMP2 may generate a data symbol Dn by sampling the data signal DATA at a sampling time point of the sampling clock signal CKDn. The second accumulator ACM2 may be enabled when the data symbol Dn satisfies a specific condition by applying a fitting coefficient CF to the data symbol Dn, and applying a predetermined delay $Z^{-1}$, thereby outputting a signal level dLev having the data signal DATA. The signal level dLev may be fed back to the adder ADD to affect sampling of a next or subsequent cycle.

Referring back to FIG. 7, the level trackers TRK1 and TRK2 may be enabled when data symbols Dn−1, Dn, and Dn+1 respectively have a predetermined weak data pattern to determine signal levels of a data signal when the data symbol Dn is sampled. The first and second level trackers TRK1 and TRK2 may determine signal levels of opposite types of weak data patterns.

The weak data pattern may refer to a data pattern in which a sampling error is highly likely to occur when the data signal samples data at the sampling time point of the sampling clock signal CKDn. For example, the probability of occurrence of a sampling error of the reference data symbol Dn may change according to a signal level of a preceding data symbol Dn−1 or a subsequent data symbol Dn+1 of the reference data symbol Dn. Specifically, a sampling error is most likely to occur when a data pattern has a transition point immediately before the reference data symbol Dn due to different values of the preceding data symbol Dn−1 and the reference data symbol Dn, and when a data pattern has a transition point immediately after the reference data symbol Dn due to different values of the reference data symbol Dn and the subsequent data symbol Dn+1. Advantageously, if a signal level at a point in time at which the data symbol Dn is sampled is sufficiently different from a reference level when a data signal has a weak data pattern in which a sampling error is most likely occur, an eye margin of the data signal may be improved.

FIG. 9 illustrates a signal level according to time when data patterns of consecutive data symbols Dn−1, Dn, and Dn+1 are (0, 1, 1) and (1, 1, 0). In both cases in which the data patterns are (0, 1, 1) and (1, 1, 0), a value of "1" may need to be output when a data signal is sampled with the sampling clock signal CKDn.

The data patterns (0, 1, 1) and (1, 1, 0) may be examples of opposing types of weak data patterns. The data pattern (0, 1, 1) may be a data pattern having a transition point immediately before the reference data symbol Dn. A period of time may be required for the signal level to transition. After a level of the data signal rises above a reference level Vref, the sampling clock signal CKDn may need to sample data such that the reference data symbol Dn is precisely sampled. Conversely, the data pattern (1, 1, 0) may be a data pattern having a transition point immediately after the reference data symbol Dn. Before the level of the data signal falls below the reference level Vref, the sampling clock signal CKDn may need to sample the data such that the reference data symbol Dn is precisely sampled.

FIG. 9 illustrates various sampling time points CKDn_E, CKDn_OPT, and CKDn_L according to a phase of the sampling clock signal CKDn. At a sampling time CKDn_E, a signal level of a weak data pattern (1, 1, 0) may be significantly different from the reference level Vref. However, the signal level of the weak data pattern (0, 1, 1) may have little difference from the reference level Vref. A minimum value of the signal level at the sampling time point CKDn_E may have little difference from the reference level Vref, and thus the sampling time point CKDn_E may be a point in time at which a data signal has a small eye margin.

Conversely, at a sampling time point CKDn_L, a signal level of a weak data pattern (0, 1, 1) may be significantly different from the reference level Vref. However, the signal level of the weak data pattern (1, 1, 0) may have little difference from the reference level Vref. Similarly, a minimum value of the signal level at the sampling time point CKDn_L may have little difference from the reference level Vref, and thus the sampling time point CKDn_L may also be a point in time at which a data signal has a small eye margin.

At a sampling time point CKDn_OPT, the signal levels of the weak data patterns (0, 1, 1) and (1, 1, 0) may have a difference from the reference level Vref. That is, the minimum value of the signal level at the sampling time point CKDn_L may have a difference from the reference level Vref, and thus the sampling time point CKDn_OPT may be a point in time at which a data signal has a relatively large eye margin, as compared to the sampling time points CKDn_E and CKDn_L.

According to an example embodiment of the present disclosure, the sampling clock adjustment circuit 2235 may adjust a phase of the sampling clock signal CKDn such that data is sampled at a point in time at which a signal level when the data symbols Dn−1, Dn, and Dn+1 have the weak data pattern (0, 1, 1) and a signal level when the data symbols Dn−1, Dn, and Dn+1 have the weak data pattern (1, 1, 0) become the same. The point in time at which the signal levels become the same may be a point in time at which a minimum value of a difference value between a signal level and a reference level is maximized, and may be a point in time at which an eye margin of a data signal is maximized.

Referring back to FIG. 7, the first comparator CMP1 may compare a first signal level output from a first level tracker TRK1 and a second signal level output from a second level tracker TRK2, and may output a result value according to a comparison result. For example, a result value of "1" may be output when the first signal level corresponding to the weak data pattern (0, 1, 1) is greater than the second signal level corresponding to the weak data pattern (1, 1, 0), and a result value of "−1" may be output when the second signal level is greater than the first signal level.

The first accumulator ACM1 may accumulate result values output from the first comparator CMP1. The first accumulator ACM1 may output, based on the accumulated values, the sampling clock adjustment signal CKD_CAL for adjusting a phase of a sampling clock signal. For example, while the first signal level has a greater value than the second signal level, the result value of "1" may be accumulated in the first accumulator ACM1 several times. The first accumulator ACM1 may output the sampling clock adjustment signal CKD_CAL such that the first signal level is similar to the second signal level.

Referring back to FIG. 9, a case in which the first signal level corresponding to the weak data pattern (0, 1, 1) is greater than the second signal level corresponding to the weak data pattern (1, 1, 0) may occur when a phase of the sampling clock signal CKDn lags behind an optimal sampling time point CKDn_OPT. Accordingly, the sampling clock adjustment signal CKD_CAL including a code value for advancing the phase of the sampling clock signal CKDn may be output. The phase of the sampling clock signal CKDn may be changed based on the sampling clock adjustment signal CKD_CAL.

When magnitudes of the first signal level and the second signal level become similar as the phase of the sampling clock signal CKDn is changed, result values of "1" and "−1" may be accumulated at a specific ratio, and the accumulated values may converge to a specific value, for example, "0." The first accumulator ACM1 may output the sampling clock adjustment signal CKD_CAL for maintaining a current state. When this occurs, the sampling clock adjustment signal CKD_CAL may maintain the phase of the sampling clock signal CKDn.

In the examples of FIGS. 7 to 9, an example in which the sampling clock adjustment circuit 2235 adjusts the phase of the sampling clock signal CKDn using the weak data patterns (0, 1, 1) and (1, 1, 0) is described, but the present disclosure is not limited thereto. The sampling clock adjustment circuit 2235 may use a data pattern in which a transition point is positioned immediately before a reference data sample Dn and a data pattern in which the transition point is positioned immediately after the reference data sample Dn to adjust the phase of the sampling clock signal CKDn. For example, the sampling clock adjustment circuit 2235 may adjust the phase of the sampling clock signal CKDn using the data patterns (0, 0, 1) and (1, 0, 0).

Figure 10:
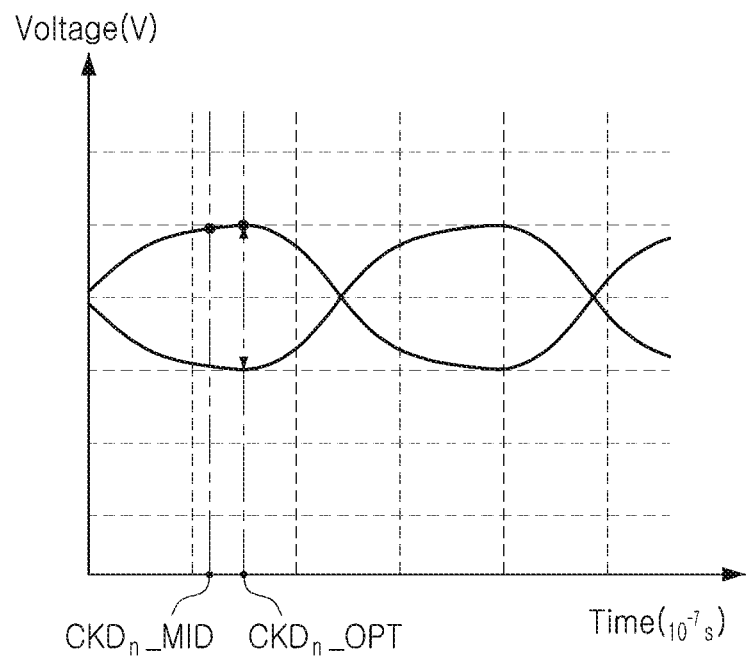
FIG. 10 is a diagram illustrating a simulation of a result of adjusting phases of multiphase sampling clocks according to an example embodiment of the present disclosure.

FIG. 10 is a diagram illustrating a simulation of a result of adjusting phases of multiphase sampling clocks according to an example embodiment of the present disclosure. In particular, FIG. 10 illustrates a voltage level of a data signal according to time. FIG. 10 illustrates a comparison between a sampling time point of the central sampling clock signal CKDn_MID and a sampling time point of the optimal sampling clock signal CKDn_OPT according to an example embodiment of the present disclosure. Referring to FIG. 10, a data signal may be a wider eye margin at the sampling time point of the optimal sampling clock signal CKDn_OPT. Accordingly, a sampling error rate of the data signal may be reduced.

Hereinafter, a method of adjusting phases of multiphase edge clocks according to an example embodiment of the present disclosure will be described in detail with reference to FIGS. 11 to 15D.

Figure 11:
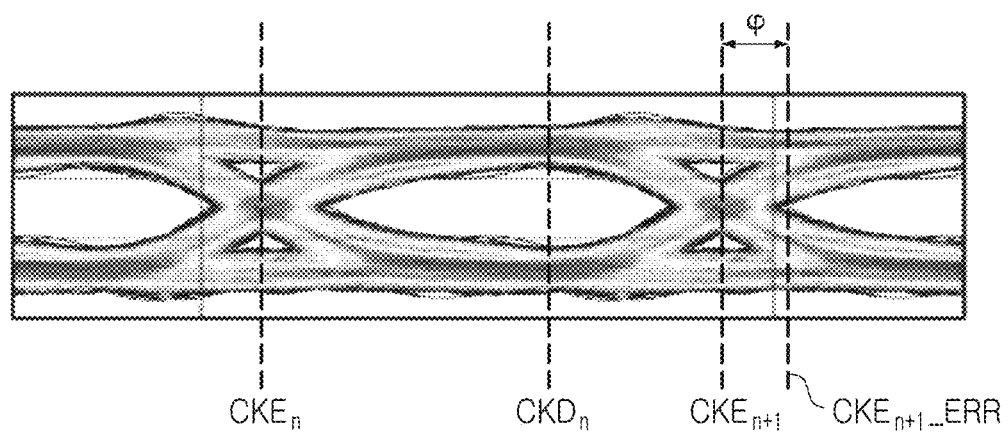
FIG. 11 is a diagram schematically illustrating a method of adjusting phases of multiphase edge clocks according to an example embodiment of the present disclosure.

FIG. 11 is a diagram schematically illustrating a method of adjusting phases of multiphase edge clocks according to an example embodiment of the present disclosure. In particular, FIG. 11 illustrates an eye diagram of a data signal. Sampling time points of the edge clock signals CKEn and CKEn+1 having phases adjacent to each other and a sampling time point of the sampling clock signal CKDn between the edge clock signals CKEn and CKEn+1 are illustrated on the eye diagram.

The sampling time points of the edge clock signals CKEn and CKEn+1 may be adjusted to be precisely positioned in a transition section of a data signal. Even when phases of the multiphase edge clock signals CKE0 to CKE3 are adjusted to have an equal interval therebetween, the phases of the edge clock signals CKE0 to CKE3 may change due to a change in temperature during operation of the second semiconductor device 200 or a change in voltage supplied to the second semiconductor device 200. For example, FIG. 11 illustrates an edge clock signal CKEn+1_ERR in which a sampling time point is shifted by "φ" due to a change in a phase of the edge clock signal CKEn+1.

The edge clock signals CKE0 to CKE3 may be separate clock signals. Thus, when the phases of the edge clock signals CKE0 to CKE3 change, respectively, an interval between the edge clock signals CKE0 to CKE3 may also change to not be regular. When the interval between the edge clock signals CKE0-CKE3 change to not be regular, yet a data signal received by a receiver is received on a regular cycle, the sampling clock signals CKE0 to CKE3 may also be adversely affected.

According to an example embodiment of the present disclosure, the second receiver 220 may detect an edge clock signal whose phase changes among the edge clock signals CKE0-CKE3. In addition, the second receiver 220 may adjust the phase of the detected edge clock signal in real time such that the phases of the edge clock signals CKE0 to CKE3 have an equal interval therebetween. According to an example embodiment of the present disclosure, the second receiver 220 may compensate for changes in the phases of the edge clock signals CKE0 to CKE3 due to a change in temperature or a change in supply voltage of the second semiconductor device 200.

Figure 12A:
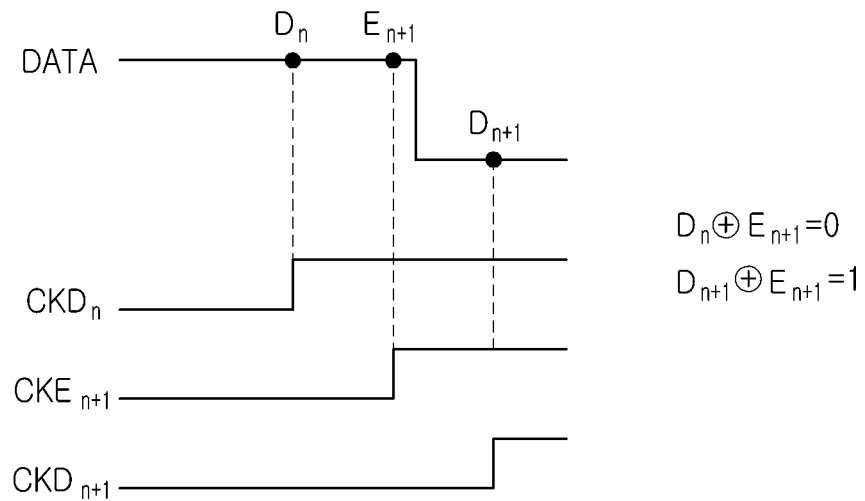
FIG. 12A to 12C are diagrams illustrating a method of detecting phases of multiphase edge clocks according to an example embodiment of the present disclosure.
Figure 12B:
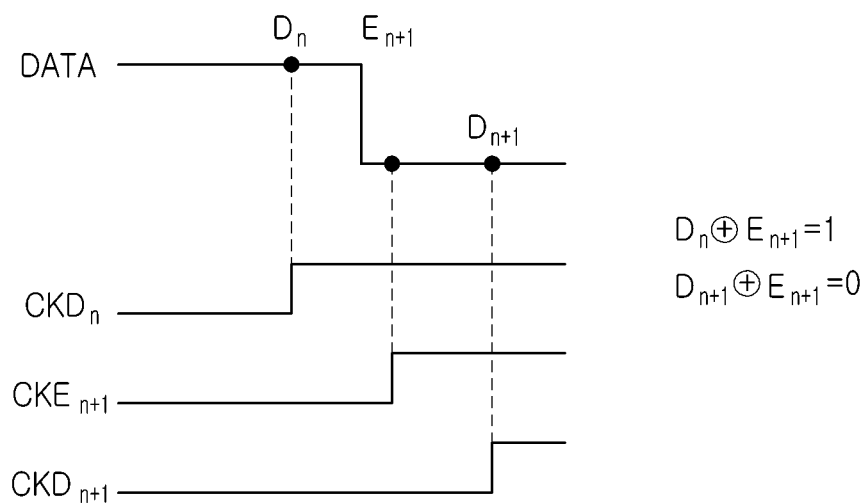
Figure 12C:
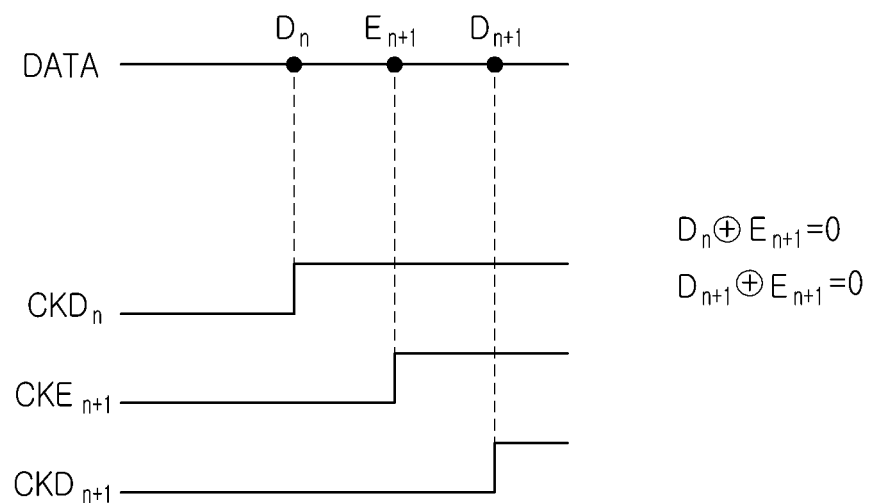

FIGS. 12A to 12C are diagrams illustrating a method of detecting phases of multiphase edge clocks according to an example embodiment of the present disclosure. When the phase detector described with reference to FIG. 5 is used, it may be determined whether a phase of the clock signal CKEn precedes or lags behind the transitioning data signal DATA. FIGS. 12A and 12B respectively illustrate a case in which a clock signal precedes a transition of a data signal, and a case in which the clock signal lags behind the transition of the data signal, and FIG. 12C illustrates a case in which the data signal does not transition.

Referring to FIGS. 12A to 12C, the data signal DATA may be sampled at rising edges of clock signals CKDn, CKEn+1, and CKDn+1, respectively, and values of data symbols Dn and Dn+1 and an edge symbol En+1 may be determined. As shown by FIG. 12A, when Dn and En+1 have the same value and Dn+1 and En+1 have different values, it may be determined that the edge clock signal CKEn+1 precedes the transition of the data signal. But, as shown by FIG. 12B, when Dn and En+1 have different values and Dn+1 and En+1 have the same value, it may be determined that the edge clock signal CKEn+1 lags behind the transition of the data signal. And, as shown by FIG. 12C, when Dn and En+1 have the same value and Dn+1 and En+1 have the same value, it may be determined that the data signal does not transition.

According to an example embodiment of the present disclosure, the edge clock adjustment circuit 2234 may detect a state in which phases of the multiphase edge clock signals CKE do not have an equal interval therebetween by comparing, with each other, signals sampled by respective multiphase edge clock signals CKE and data symbols sampled by respective multiphase sampling clock signals CKD.

Figure 13:
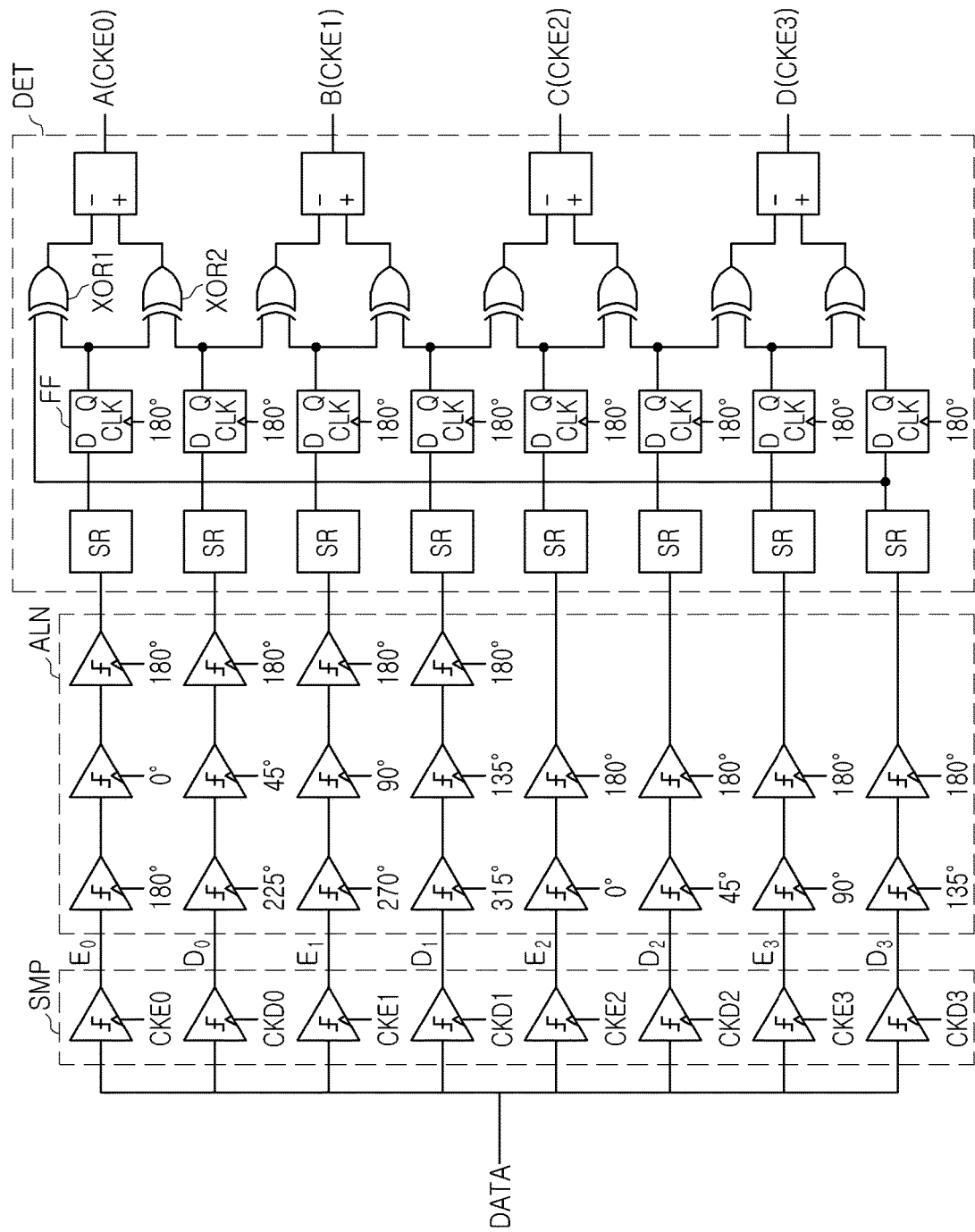
FIG. 13 is a diagram more specifically illustrating an edge clock adjustment circuit in the clock data recovery circuit of FIG. 4.

FIG. 13 is a diagram more specifically illustrating an edge clock adjustment circuit in the clock data recovery circuit of FIG. 4. The edge clock adjustment circuit 2234 may include a sampling unit SMP, an alignment unit ALN, and a determination unit DET. The sampling unit SMP may sample the data signal DATA in respective sampling cycles of the multiphase edge clock signals CKE0 to CKE3 and the multiphase sampling clock signals CKD0 to CKD3, thereby generating edge symbols E0 to E3 and data symbols D0 to D3. The clock signals CKE0 to CKE3 and CKD0 to CKD3 may correspond to the clock signals CKE0 to CKE3 and CKD0 to CKD3 described with reference to FIG. 2.

The alignment unit ALN may respectively delay the edge symbols E0 to E3 and the data symbols D0 to D3 sampled from the sampling unit SMP to align sampled signals, such that the sampled signals are activated at the same time point. In the sampling unit SMP, the data signal DATA may be sampled based on clock signals having different phases. Timings at which the sampled signals are respectively output may be different from each other, the alignment unit ALN may temporally align the sampled signals by delaying the sampled signals by different time periods.

The determination unit DET may transfer the aligned signals to XOR gates via latches SR and flip-flops FF. The XOR gates may simultaneously compare the aligned signals with each other, thereby determining whether respective phases of the edge clock signals CKE0 to CKE3 precede or lag behind a phase of a data signal, and outputting determination signals A to D.

Taking a determination signal A as an example, the determination signal A may be a signal indicating whether a phase of the edge clock signal CKE0 precedes or lags behind a transition of the data signal DATA. A signal E0 sampled by the edge clock signal CKE0 and a signal D3 sampled by the sampling clock signal CKD3 may be applied to a first XOR gate XOR1. In addition, the signal E0 sampled by the edge clock signal CKE0 and the signal D0 sampled by the sampling clock signal CKD0 may be applied to a second XOR gate XOR2. As described with reference to FIGS. 12A to 12C, the determination signal A may be output by comparing the sampled signals D3, E0 and D0 with each other.

FIGS. 14A to 14D are diagrams illustrating a method of adjusting phases of multiphase edge clocks according to an example embodiment of the present disclosure. In particular, FIGS. 14A to 14D are diagrams illustrating whether phases of the edge clock signals CKE0 to CKE3 precede or lag behind a phase of a data signal, respectively. Sampling time points of the sampling clock signals CKD0 to CKD3 and the edge clock signals CKE0 to CKE3 are illustrated in FIGS. 14A to 14D.

Figure 14A:
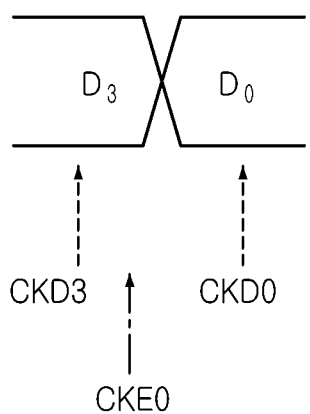
FIGS. 14A to 14D are diagrams illustrating a method of adjusting phases of multiphase edge clocks according to an example embodiment of the present disclosure.

FIG. 14A illustrates a case in which a phase of the edge clock signal CKE0 precedes the phase of the data signal. When a transition occurs between the data symbol D3 and the data symbol D0, values sampled at sampling time points of CKD3 and CKE0 may be the same, and values sampled at sampling time points of CKD1 and CKE0 may be different from each other. The edge clock adjustment circuit 2234 may determine that the phase of the edge clock signal CKE0 precedes by comparing values sampled at sampling time points of CKD3, CKE0, and CKD0.

Figure 14B:
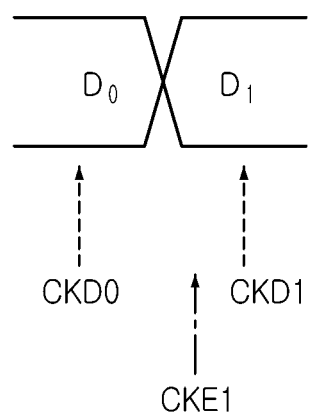

FIG. 14B illustrates a case in which a phase of the edge clock signal CKE1 lags behind the phase of the data signal. When a transition occurs between the data symbol D0 and the data symbol D1, values sampled at sampling time points of CKD0 and CKE1 may be different from each other, and values sampled at sampling time points of CKD1 and CKE1 may be the same. The edge clock adjustment circuit 2234 may determine that the phase of the edge clock signal CKE1 lags by comparing values sampled at sampling time points of CKD0, CKE1, and CKE1.

Figure 14C:
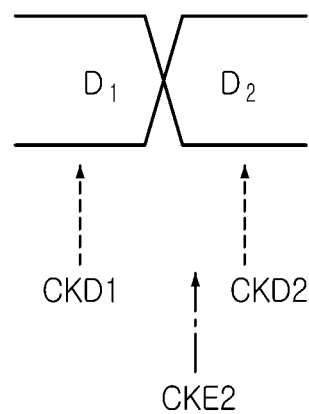
Figure 14D:
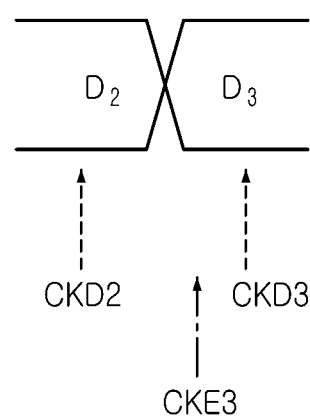

In the same manner as FIG. 14B, in the examples of FIGS. 14C and 14D, the edge clock adjustment circuit 2234 may determine that phases of the edge clock signals CKE2 and CKE3 also lag behind the data signal. In the examples of FIGS. 14A to 14D, it may be determined that the phase of the edge clock signal CKE0 precedes the data signal, and phases of the edge clock signals CKE1 to CKE3 lag behind the data signal. When only the phase of one of the edge clock signals CKE0 precedes the data signal, a phase interval between the edge clock signals may change. In addition, a value of the determination signal A may be different from values of remaining determination signals B to D.

According to an example embodiment of the present disclosure, when the edge clock adjustment circuit 2234 detects that one of the values of the determination signals A to D is different from remaining values of the determination signals A to D, the edge clock adjustment circuit 2234 may adjust a value of the edge clock adjustment signal CKE_CAL such that a phase of an edge clock signal, which corresponds to a determination signal having a different value, is adjusted. The edge clock adjustment circuit 2234 may adjust the value of the edge clock adjustment signal CKE_CAL until the values of the determination signals A to D become equal to each other.

Figure 15A:
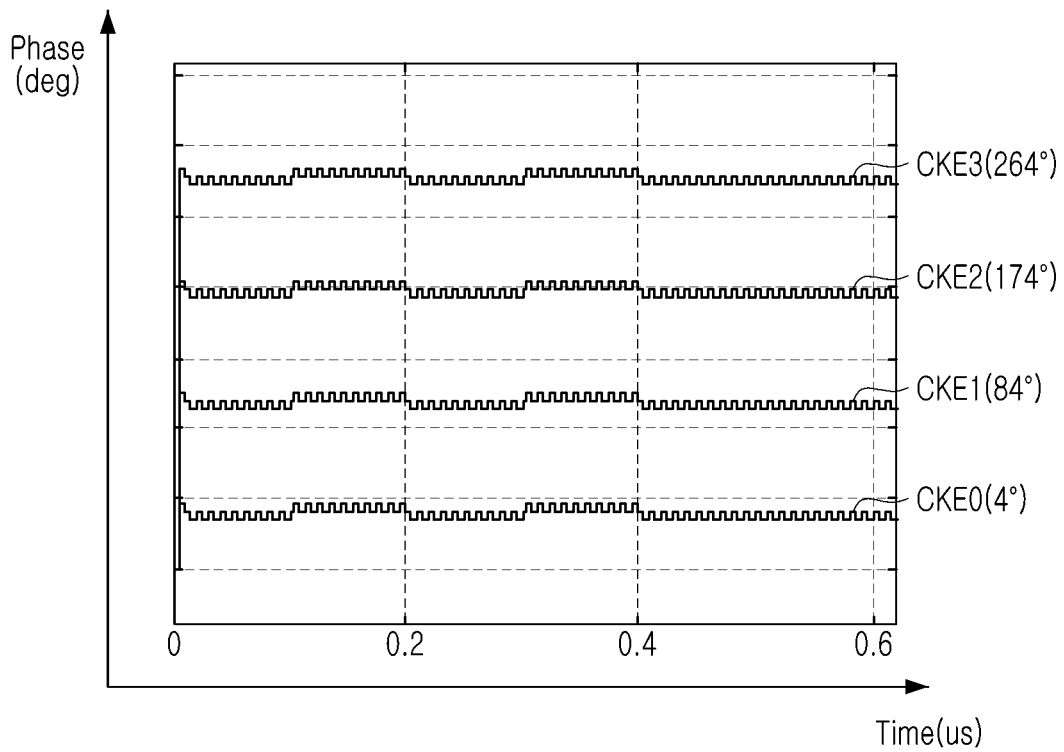
FIGS. 15A to 15C are diagrams illustrating a simulation of a result of adjusting phases of multiphase edge clocks according to an example embodiment of the present disclosure.
Figure 15B:
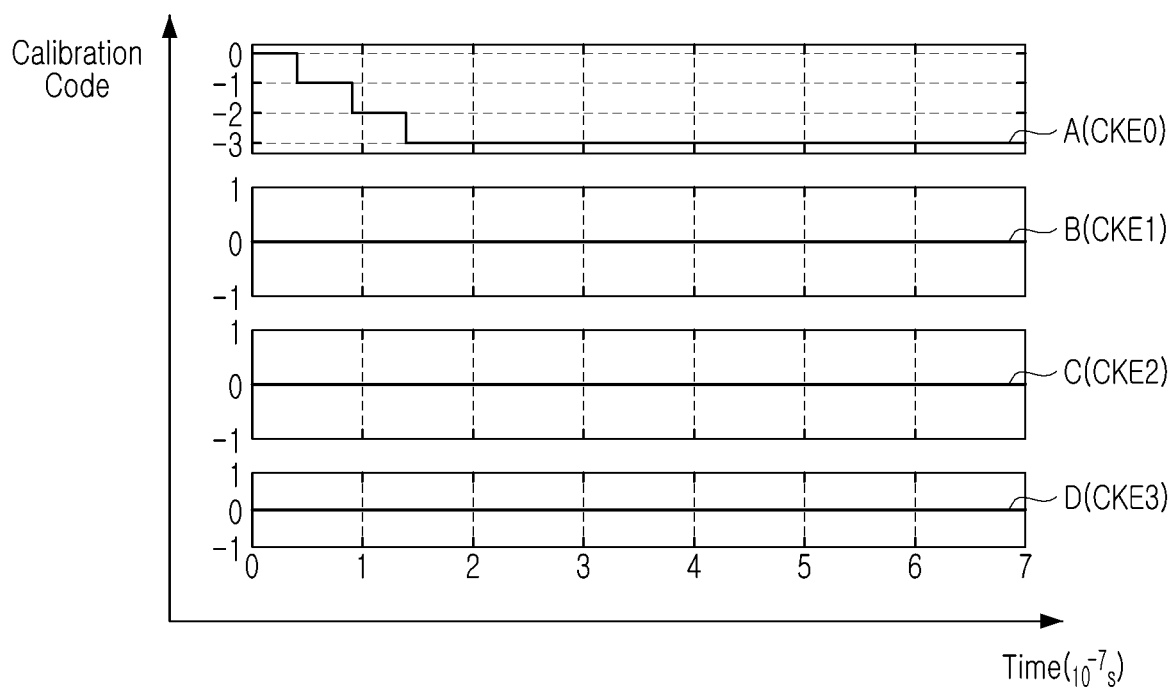
Figure 15C:
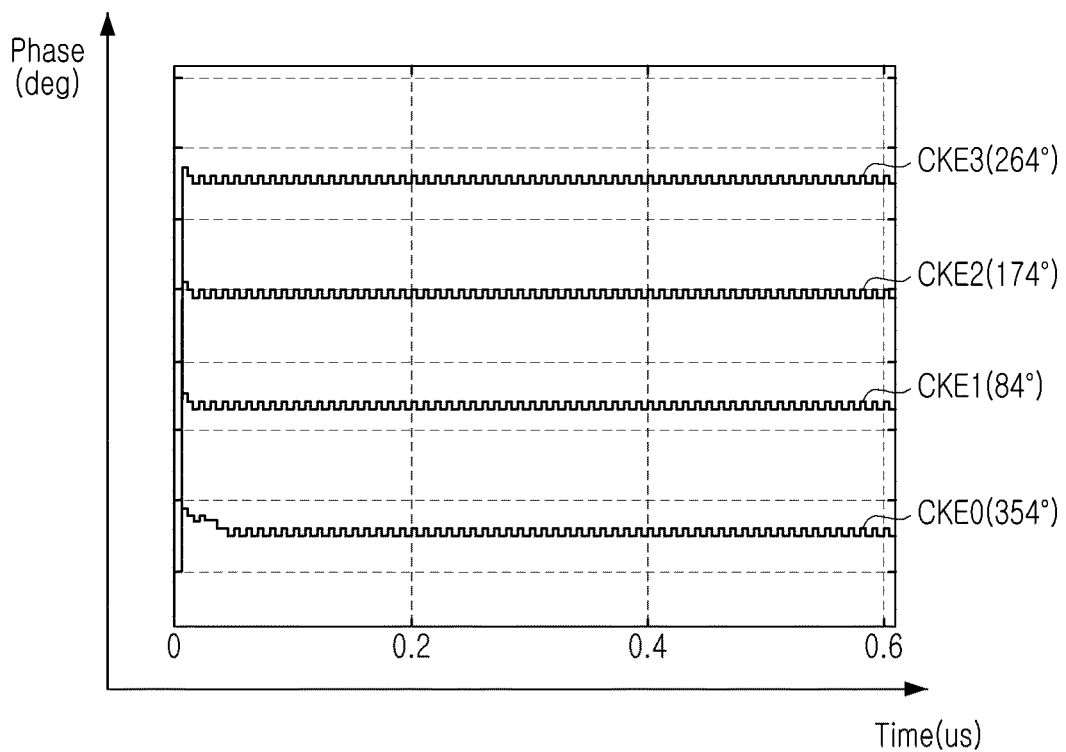

FIGS. 15A to 15C are diagrams illustrating a simulation of a result of adjusting phases of multiphase edge clocks according to an example embodiment of the present disclosure. In particular, FIG. 15A illustrates phases of edge clock signals before the phases of the edge clock signals are adjusted. FIG. 15B illustrates adjustment of a value of the edge clock adjustment signal CKE_CAL based on the phases of the edge clock signals, and FIG. 15C illustrates phases of the edge clock signals CKE0 to CKE3 after the phases are adjusted according to an example embodiment of the present disclosure.

Referring to FIGS. 2 and 15A together, a data signal may transition at 0 degrees, 90 degrees, 180 degrees, and 270 degrees. In the example of FIG. 15A, phases of the edge clock signals CKE0 to CKE3 may be 4 degrees, 84 degrees, 174 degrees, and 264 degrees, respectively. A phase of the edge clock signal CKE0 may lag behind a phase at which the data signal transitions, and phases of the remaining edge clock signals CKE1 to CKE3 may precede the phase at which the data signal transitions. That is, the edge clock signals CKE0 to CKE3 may not have an equal interval therebetween. When only the phase of the edge clock signal CKE0 among the edge clock signals CKE0 to CKE3 lags, only the determination signal A among the determination signals A to D may have a different value.

Referring to FIG. 15A, when the edge clock signals CKE0 to CKE3 do not have an equal interval therebetween, clock phases of the edge clock signals CKE0 to CKE3 may not be maintained to be regular, and a phase skew oscillating in a predetermined range may occur. Referring to FIG. 15B, the edge clock adjustment circuit 2234 may output the edge clock adjustment signal CKE_CAL for adjusting a code value corresponding to the determination signal A. In the example of FIG. 15A, only the phase of the edge clock signal CKE0 may lag. Thus, the edge clock adjustment circuit 2234 may change the code value until the phase of the edge clock signal CKE0 is advanced with respect to the phase at which the data signal transitions.

Referring to FIG. 15C, as a result of adjusting the phase of the edge clock signal CKE0, the phase of the edge clock signal CKE0 may converge to 354 degrees. The phases of the edge clock signals CKE0 to CKE3 may be all advanced with respect to the phase at which the data signal transitions, and thus the edge clock adjustment circuit 2234 may maintain the code value. The phase of the edge clock signal CKE0 may be adjusted, thereby maintaining the phases of the edge clock signals CKE0 to CKE3 to have an equal interval therebetween, and removing a phase skew.

According to an example embodiment of the present disclosure, when the phases of the edge clock signals CKE0 to CKE3 all precede or all lag behind the phase at which the data signal transitions, phase adjustment of the edge clock signals CKE0 to CKE3 may not be performed. Accordingly, in the example of FIG. 15C, the phases of the edge clock signals CKE0 to CKE3 may not precisely correspond to the phase at which the data signal transitions, and may respectively have a phase advanced by six degrees (6°). However, according to an example embodiment of the present disclosure, the phases of the sampling clock signals CKD0 to CKE3 may be adjusted in real time to a phase in which an eye margin of a data pattern is maximized. Accordingly, even when there is a slight difference between the phases of the edge clock signals CKE0 to CKE3 and the phase at which the data signal transitions, the data signal may be precisely sampled.

When the first and second clock signals CLK1 and CLK2 described with reference to FIGS. 1 and 3 are received from different clock generation circuits, there may be an error in a frequency of a data signal output from the transmitter 110 and a clock frequency multiplied by the receiver 220. According to an example embodiment of the present disclosure, the phases of the edge clock signals CKE0 to CKE3 and the sampling clock signals CKD0 to CKD3 may be adjusted in real time. Thus, even when there is a slight error in a frequency, the error may be compensated. Accordingly, a sampling error rate of the receiver 220 may be reduced, and reliability of the electronic system 10 may be improved.

Figure 16:
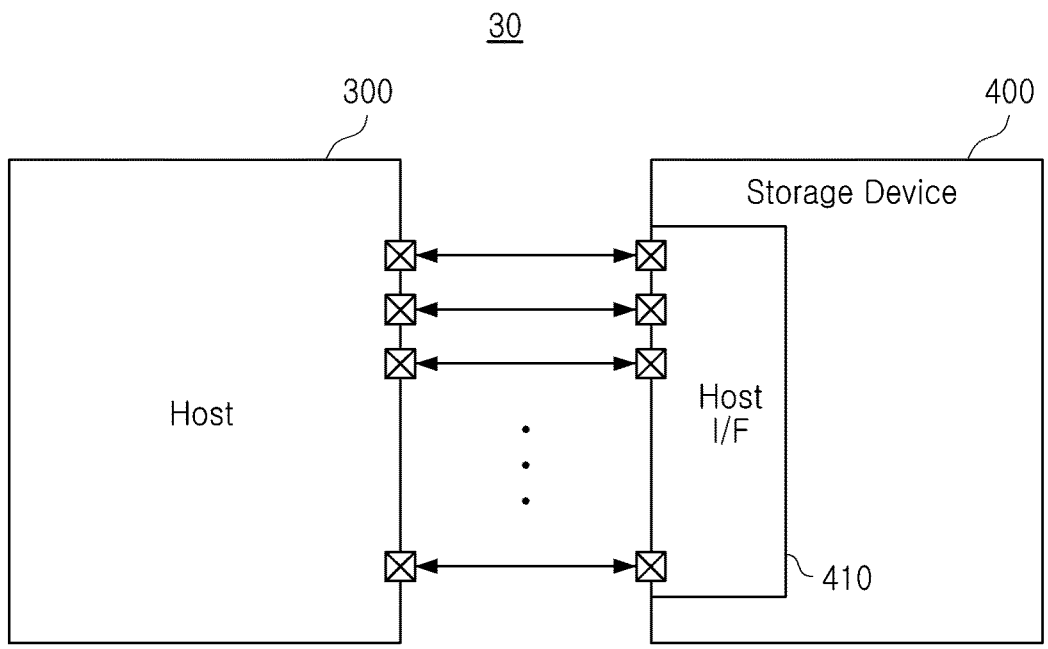
FIGS. 16 and 17 are diagrams illustrating a system to which a clock data recovery circuit is applicable according to an example embodiment of the present disclosure.
Figure 17:
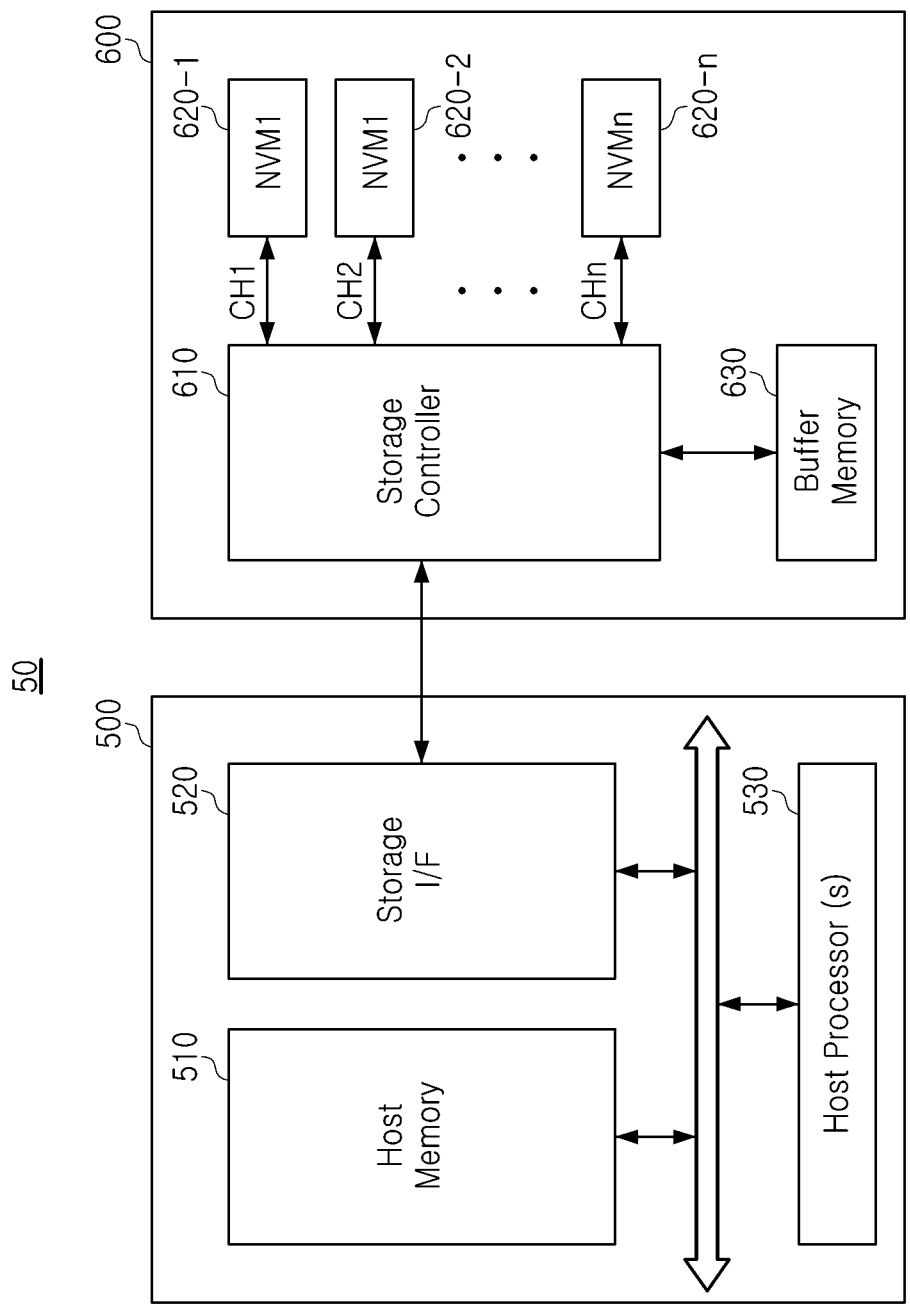

FIGS. 16 and 17 are diagrams illustrating a system to which a clock data recovery circuit is applicable according to an example embodiment of the present disclosure. Referring to FIG. 16, an electronic system 30 may include a host 300 and a storage device 400. The host 300 may correspond to the first semiconductor device 100 described with reference to FIG. 1, and the storage device 400 may correspond to the second semiconductor device 200 described with reference to FIG. 1. The host 300 and the storage device 400 may exchange data via a plurality of input/output pins.

The storage device 400 may include a host interface 410. The host interface 410 may be configured to process an interface protocol employed in the storage device 400 to communicate with the host 300. The interface circuit 410 may be configured to support at least one of various interface protocols. For example, the interface circuit 410 may support an interface protocol such as PCIe.

The interface circuit 410 may include several layers. For example, the interface circuit 410 may include a physical layer including physical electronic circuits configured to transmit or receive a signal. In addition, the interface circuit 410 may include a link layer configured to process a data symbol, manage combination and decomposition of a packet, control a communication path and a timing, detect an error, and the like. In addition, the interface circuit 410 may include an application layer configured to transmit or receive information via a link layer and to provide a service.

The interface circuit 410 may train the physical layer before the link layer is driven. The physical layer of the interface circuit 410 may include a reception circuit and a transmission circuit. The reception circuit and the transmission circuit may correspond to the transmitter 210 and the receiver 220 described with reference to FIGS. 1 and 3. The reception circuit and the transmission circuit may receive and transmit signals according to the interface protocol employed by the interface circuit 410, and may process the received and transmitted signals.

The reception circuit may sample, based on multiphase sampling clock signals, a data signal received from the host 300. The reception circuit may detect a phase at which the data signal received from the host 300 transitions to recover multiphase edge clock signals and to determine, based on the multiphase edge clock signals, phases of the multiphase sampling clock signals.

According to an example embodiment of the present disclosure, the reception circuit may adjust the phases of the multiphase edge clock signals and the multiphase sampling clock signals while the link layer is driven. Specifically, when a case in which sampling time points of some edge clock signals among the multiphase edge clock signals precede transition points in time of the data signal, and sampling time points of some of remaining edge clock signals lag behind the transition points in time of the data signal is detected, the reception circuit may adjust the phases of the multiphase edge clock signals such that the sampling time points have an equal interval therebetween.

In addition, the reception circuit may detect predetermined data patterns from the sampled data signal using the multiphase sampling clock signals, and may compare signal levels at sampling time points of respective reference data symbols of the predetermined data patterns. According to a comparison result, the phases of the multiphase sampling clock signals may be adjusted.

According to an example embodiment of the present disclosure, the reception circuit may adjust phases of clock signals in real time while the link layer is driven, thereby improving reliability of the storage device 400 despite a change in an operating environment of the storage device 400.

Referring now to FIG. 17, an electronic system 50 may include a host 500 and a storage device 600. The host 500 may include a host memory 510, a storage interface 520, and a processor 530. When the host memory 510 is used as a working memory, an application program, a file system, a device driver, or the like may be loaded into the host memory 510. However, when the host memory 510 is used as a temporary buffer for data transmission to the storage device 600, data may be stored therein. Although one host memory is illustrated in the drawings, a plurality of host memories may be provided to have different uses. The host memory 510 may include a volatile memory such as static RAM (SRAM), dynamic RAM (DRAM), or synchronous DRAM (SDRAM), a nonvolatile memory such as phase-change RAM (PRAM), magnetic RAM (MRAM), resistive RAM (RRAM), or ferroelectric RAM (FRAM), or a combination thereof.

The storage interface 520 may provide a physical connection via which the host 500 and the storage device 600 is interfaceable. The storage interface 620 may transmit, to the storage device 600, a command, an address, data, or the like generated in response to various requests. An interfacing method of the storage interface 520 may be NVM express (NVMe) based on PCI express (PCIe). However, the storage interface 520 is not limited to NVMe.

The host processor 530 may execute software (for example, an application program, an operating system (OS), a device driver, or the like) executed by the host 500. For example, the host processor 530 may execute an OS and an application program loaded into the host memory 510. The host processor 530 may control to store, in the host memory 510, program data to be stored in the storage device 600 or to store, in the host memory 510, data to be read from the storage device 600.

The storage device 600 may include a storage controller 610, a plurality of nonvolatile memories 620-1 to 620-n, and a buffer memory 630. The storage controller 610 may provide interfacing between the host 500 and the storage device 600. The storage controller 610 may determine whether commands having the same property among commands fetched from the host 500 exceed a reference ratio to adjust the number of pointers simultaneously fetched. For example, when commands related to a write operation exceed the reference ratio, the number of pointers simultaneously fetched may be reduced. Alternatively, when commands related to a read operation exceed the reference ratio, the number of pointers simultaneously fetched may be increased. Alternatively, when a ratio of commands not related to the write operation and the read operation (that is, a command related to system setting, or the like) exceeds the reference ratio, the number of pointers simultaneously fetched may be increased.

Such data processing operations may be performed according to a PCIe-based NVMe interface method. However, the interfacing method is not limited to NVMe. As described above, the interfacing method may be applied to any interfacing method enabling transmission and reception of data by fetching a command generated in a host memory and then fetching a pointer indicating a physical address of the memory corresponding to the generated command.

The nonvolatile memories 620-1 to 620-n may include one of nonvolatile memories such as flash memory, PRAM, MRAM, RRAM, FRAM, and the like, or a combination thereof. The buffer memory 630 may serve as a buffer in which read data or write data is temporarily stored when a read operation or a write operation is performed. For example, the buffer memory 630 may be DRAM. However, the present disclosure is not limited thereto, and may include a volatile memory such as SRAM, SDRAM, or the like, or a combination thereof.

The storage controller 610 according to an example embodiment of the present disclosure may extract multiphase clock signals from a transition of a signal received from the host 500, and may sample the signal based on the extracted clock signals. In addition, the storage controller 610 may adjust phases of the multiphase clock signals in real time using a signal exchanged with the host 500. Accordingly, a sampling error rate of the storage controller 610 may be reduced, and reliability of the storage device 600 may be improved. A clock data recovery circuit according to example embodiments of the present disclosure may respond to a change in temperature or supply voltage in real time by adjusting a phase of an edge clock and a phase of a sampling clock during operation of a reception circuit.

The clock data recovery circuit according to an example embodiment of the present disclosure may adjust phases of multiphase edge clocks at an equal interval, and may adjust the phases of multiphase sampling clocks to a phase in which an eye margin of a data signal is maximized, thereby reducing occurrence of a sampling error.

An electronic system including a clock data recovery circuit according to an example embodiment of the present disclosure may adjust a phase of an edge clock and a phase of a sampling clock, even when a transmission circuit and a reception circuit operate in synchronization with clock signals received from different clock generation circuits, thereby compensating for an error between the clock signals in real time.

The issues to be resolved by the present disclosure are not limited to the issue described above, and other issues not described will be clearly understood by those skilled in the art from the following description.

While example embodiments have been shown and described above, it will be apparent to those skilled in the art that modifications and variations could be made without departing from the scope of the present disclosure as defined by the appended claims.

What is claimed is:

1. A clock data recovery circuit, comprising:
   a phase-locked loop configured to generate a plurality of clock signals having unequal phases relative to each other, in response to a received clock signal;
   a phase interpolator configured to interpolate phases of the plurality of clock signals during generation of multiphase sampling clock signals; and
   a sampling clock adjustment circuit configured to generate a plurality of data symbols by sampling a received data signal at sampling time points of the multiphase sampling clock signals, and further configured to: (i) detect, from the plurality of data symbols, a first data pattern set to have a transition point immediately before a first reference data symbol, and a second data pattern set to have a transition point immediately after a second reference data symbol, (ii) detect a first signal level of the first data pattern at a sampling time point for sampling the first reference data symbol, (iii) detect a second signal level of the second data pattern at a sampling time point for sampling the second reference data symbol, and (iv) adjust phases of the multiphase sampling clock signals according to a result of comparing the first signal level to the second signal level.

2. The circuit of claim 1, wherein the first data pattern is (0, 1, 1), and the first reference data symbol is "1", which is in the middle of the first data pattern; and wherein the second data pattern is (1, 1, 0), and the second reference data symbol is "1", which is in the middle of the second data pattern.

3. The circuit of claim 2, wherein the sampling clock adjustment circuit is configured to:
   advance the phases of the multiphase sampling clock signals when a magnitude of the first signal level is greater than a magnitude of the second signal level; and
   delay the phases of the multiphase sampling clock signals when the magnitude of the first signal level is less than the magnitude of the second signal level.

4. The circuit of claim 1, wherein the first reference data symbol and the second reference data symbol have the same value.

5. The circuit of claim 4, wherein the sampling clock adjustment circuit is configured to adjust the phases of the multiphase sampling clock signals whenever a magnitude of the first signal level is unequal to a magnitude of the second signal level.

6. The circuit of claim 4, wherein the sampling clock adjustment circuit is configured to adjust the phases of the multiphase sampling clock signals such that a minimum value among a difference value between the first signal level and a reference level, and a difference value between the second signal level and the reference level, is maximized.

7. The circuit of claim 1, further comprising:
   a phase interpolation controller configured to: (i) receive, from the sampling clock adjustment circuit, a sampling clock adjustment signal, and (ii) provide, based on the sampling clock adjustment signal, a control signal to the phase interpolator.

8. The circuit of claim 1, wherein the sampling clock adjustment circuit includes:
a plurality of level trackers configured to receive the data signal and to output a signal level of the data signal at the sampling time points;
a comparator configured to compare signal levels output from the plurality of level trackers with each other, and to output a comparison result; and
an accumulator configured to accumulate the comparison result of the comparator and to output, based on a value of the accumulated comparison result, a sampling clock adjustment signal.

9. The circuit of claim 8, wherein the plurality of level trackers include a first level tracker and a second level tracker; wherein the first level tracker is configured to be enabled in response to detection of the first data pattern and to output the first signal level; and wherein the second level tracker is configured to be enabled in response to detection of the second data pattern and to output the second signal level.

10. The circuit of claim 1,
wherein the phase interpolator is configured to interpolate phases of the plurality of clock signals during generation of the multiphase sampling clock signals and generation of multiphase edge clock signals;
wherein the sampling clock adjustment circuit is configured to adjust the phases of the multiphase sampling clock signals; and
wherein the clock data recovery circuit further includes a phase detector configured to: (i) determine, based on a phase at which the data signal transitions, phases of the multiphase edge clock signals, and (ii) adjust each of the phases of the multiphase sampling clock signals to a phase having an intermediate value of two clock signals having phases adjacent to each of the phases among the multiphase edge clock signals.

11. A clock data recovery circuit, comprising:
a phase-locked loop configured to generate multiphase clock signals in response to a received clock signal;
a phase interpolator configured to interpolate phases of the multiphase clock signals during generation of multiphase edge clock signals and multiphase sampling clock signals; and
an edge clock adjust circuit configured to: (i) determine whether respective phases of the multiphase edge clock signals precede or lag behind a phase at which a data signal transitions, and (ii) adjust phases of some edge clock signals among the multiphase edge clock signals until determination results of all of the multiphase edge clock signals become the same, when determination results of the some edge clock signals are different from determination results of remaining edge clock signals.

12. The circuit of claim 11, wherein the edge clock adjustment circuit is configured to: (i) generate data symbols by sampling the data signal in synchronization with the multiphase sampling clock signals, (ii) generate edge symbols by sampling the data signal in synchronization with the multiphase edge clock signals, and (iii) determine whether the respective phases of the multiphase edge clock signals precede or lag behind a phase at which the data signal transitions, according to a result of comparing a data symbol and an edge symbol with each other when sampled at adjacent time points.

13. The circuit of claim 11, wherein the edge clock adjustment circuit includes:
a sampling unit having a plurality of comparators therein that are configured to sample the data signal at respective sampling time points of the multiphase sampling clock signals and the multiphase edge clock signals;
an alignment unit configured to temporally align signals output from the plurality of comparators at the respective sampling time points to be activated at the same time point; and
a determination unit having a plurality of XOR gates therein, which are configured to output a comparison signal indicating whether two signal values sampled at adjacent time points among the aligned signals are the same, said determination unit configured to determine whether the phases of the multiphase edge clock signals precede or lag behind the phase at which the data signal transitions based on the comparison signal.

14. The circuit of claim 11, further comprising:
a phase interpolation controller configured to receive an edge clock adjustment signal from the edge clock adjustment circuit and to provide, based on the edge clock adjustment signal, a control signal to the phase interpolator.

15. The circuit of claim 11, wherein the sampling clock adjustment circuit is configured to adjust the phases of the multiphase sampling clock signals; and wherein the clock data recovery circuit further includes a phase detector configured to determine, based on the phase at which the data signal transitions, the phases of the multiphase edge clock signals.

16. The circuit of claim 11, further comprising:
a sampling clock adjustment circuit configured to: (i) generate a plurality of data symbols by sampling the data signal at sampling time points of the multiphase sampling clock signals, (ii) detect weak data patterns from the plurality of data symbols, and (iii) adjust the phases of the multiphase sampling clock signals according to a result of comparing, with each other, signal levels at sampling time points for sampling respective reference data symbols of the weak data patterns.

17. The circuit of claim 11, wherein the sampling time point is a time point at which one of the multiphase sampling clock signals and the multiphase edge clock signals respectively have a rising edge.

18. An electronic system, comprising:
a communication channel;
a first device having a transmitter therein, which is configured to output a data signal to the communication channel; and
a second device having a receiver therein, which is connected to the communication channel, said the receiver configured to: (i) recover, based on transition time points of the data signal, multiphase edge clock signals, (ii) adjust phases of the multiphase edge clock signals such that sampling time points of the multiphase edge clock signals have an equal interval therebetween, when sampling time points of some edge clock signals among the multiphase edge clock signals precede the transition time points and sampling time points of some of remaining edge clock signals lag behind the transition time points, (iii) sample the data signal with multiphase sampling clock signals having an intermediate phase of the multiphase edge clock signals, (iv) detect predetermined data patterns from the sampled data signal, and (v) adjust phases of the multiphase sampling clock signals according to a result of comparing, with each other, signal levels at sampling time points for sampling respective reference data symbols of the predetermined data patterns.

19. The system of claim 18, further comprising:
a first clock generation circuit and a second clock generation circuit;
wherein the first device is configured to output the data signal in synchronization with a first clock signal received from the first clock generation circuit; and
wherein the second device is configured to: (i) generate the multiphase edge clock signals by multiplying a second clock signal received from the second clock generation circuit, and (ii) adjust, based on transition time points of the data signal output in synchronization with the first clock signal, the phases of the multiphase edge clock signals in real time.

20. The electronic system of claim 18, wherein the receiver is configured to receive the data signal in compliance with a PCIe interface protocol.

* * * * *